(12) United States Patent
Ko et al.

(10) Patent No.: US 11,637,222 B2
(45) Date of Patent: Apr. 25, 2023

(54) DISPLAY DEVICE AND METHOD OF MANUFACTURING THE SAME

(71) Applicant: SAMSUNG DISPLAY CO., LTD., Yongin-si (KR)

(72) Inventors: Seungcheol Ko, Hwaseong-si (KR); Sangheon Ye, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 48 days.

(21) Appl. No.: 17/334,486

(22) Filed: May 28, 2021

(65) Prior Publication Data

US 2021/0288218 A1 Sep. 16, 2021

Related U.S. Application Data

(62) Division of application No. 16/549,782, filed on Aug. 23, 2019, now Pat. No. 11,050,001.

(30) Foreign Application Priority Data

Nov. 8, 2018 (KR) .......................... 10-2018-0136730

(51) Int. Cl.
*H01L 33/38* (2010.01)
*H01L 27/15* (2006.01)
(Continued)

(52) U.S. Cl.
CPC ............ *H01L 33/38* (2013.01); *H01L 27/156* (2013.01); *G09G 3/32* (2013.01)

(58) Field of Classification Search
CPC ... H01L 33/38; H01L 27/156; H01L 25/0753; H01L 33/62; H01L 23/544;
(Continued)

(56) References Cited

U.S. PATENT DOCUMENTS 9,773,761 B2 9/2017 Do
9,865,832 B2 1/2018 Bibl et al.
(Continued)

FOREIGN PATENT DOCUMENTS

| KR | 10-1490758 B1 | 2/2015 |
| KR | 10-2018-0007376 A | 1/2018 |
| KR | 10-1820275 B1 | 1/2018 |

*Primary Examiner* — Herve-Louis Y Assouman
(74) *Attorney, Agent, or Firm* — Lewis Roca Rothgerber Christie LLP

(57) ABSTRACT

A display device includes a pixel circuit, a first insulation layer covering the pixel circuit, a first electrode disposed on the first insulation layer, a second electrode disposed on the first insulation layer while being spaced apart from the first electrode, a second insulation layer covering the first electrode, the second electrode, and the first insulation layer disposed between the first electrode and the second electrode, and a light emitting element electrically connected to the first electrode and the second electrode on the second insulation layer and disposed between the first electrode and the second electrode. Here, the second insulation layer includes a first area overlapping the first electrode, a second area overlapping the second electrode, and a stopper area disposed between the first electrode and the second electrode, and the stopper area has a thickness different from that of each of the first area and the second area.

9 Claims, 30 Drawing Sheets

(51) Int. Cl.
    *H01L 25/075*     (2006.01)
    *H01L 33/62*     (2010.01)
    *H01L 23/544*     (2006.01)
    *H01L 27/12*     (2006.01)
    *G09G 3/32*     (2016.01)

(58) Field of Classification Search
    CPC ............ H01L 27/1248; H01L 27/1259; H01L 33/005; H01L 33/22
    See application file for complete search history.

(56) References Cited

U.S. PATENT DOCUMENTS

2018/0019369 A1*   1/2018   Cho ........................ H05K 1/11
2018/0122837 A1*   5/2018   Kang ................... H01L 27/124

* cited by examiner

DISPLAY DEVICE AND METHOD OF MANUFACTURING THE SAME

CROSS-REFERENCE TO RELATED APPLICATIONS

This application is a divisional of U.S. patent application Ser. No. 16/549,782, filed Aug. 23, 2019, which claims priority to and the benefit of Korean Patent Application No. 10-2018-0136730, filed Nov. 8, 2018, the entire content of both of which is incorporated herein by reference.

BACKGROUND

The present disclosure herein relates to a display device, and more particularly, to a display device including a micro light emitting element.

A light emitting diode (LED), which is a type of light emitting element, has a high light conversion efficiency, low power consumption, a long lifespan, and is environmentally friendly. Accordingly, the light emitting element is used in various fields such as signal lights, mobile phones, vehicle headlights, outdoor advertisement boards, LCD back light units (BLU), and indoor and outdoor lights.

In order to use the light emitting element in lights or displays, the light emitting element is necessarily connected to an electrode capable of applying power thereto. Also, usage purposes, reduction in a space occupied by the electrode, and an arrangement relationship between the light emitting element and the electrode, which is related to a manufacturing method, have been researched in various ways.

The arrangement relationship between the light emitting element and the electrode may be classified into a method of directly growing the light emitting element on the electrode and a method of separately independent-growing the light emitting element and then arranging the grown light emitting element on the electrode. In the latter method, in the case of a conventional light emitting element, a three-dimensional light emitting element may be erected and connected to the electrode. However, in the case of a micro light emitting element in a nano unit, the micro light emitting element is difficult to be erected.

SUMMARY

The present disclosure provides a display device capable of easily aligning a micro light emitting element between two electrodes.

The present disclosure also provides a method of manufacturing a display device capable of easily aligning a micro light emitting element between two electrodes.

An exemplary embodiment of the inventive concept provides a display device including: a pixel circuit; a first insulation layer covering the pixel circuit; a first electrode disposed on the first insulation layer; a second electrode disposed on the first insulation layer while being spaced apart from the first electrode; a second insulation layer covering the first electrode, the second electrode, and the first insulation layer disposed between the first electrode and the second electrode; and a light emitting element electrically connected to the first electrode and the second electrode on the second insulation layer and disposed between the first electrode and the second electrode. Here, the second insulation layer includes a first area overlapping the first electrode, a second area overlapping the second electrode, and a stopper area disposed between the first electrode and the second electrode, and the stopper area has a thickness different from that of each of the first area and the second area.

In an exemplary embodiment, the stopper area may have a minimum thickness less than that of each of the first area and the second area.

In an embodiment, the stopper area may have a width in a first direction, which is equal to or greater than a length of the light emitting element in the first direction.

In an exemplary embodiment, a difference between a minimum thickness of each of the first area and the second area and a minimum thickness of the stopper area may be about 3000 Å or more.

In an exemplary embodiment, each of the first area and the second area may have a minimum thickness of about 5000 Å, and the stopper area may have a minimum thickness of about 2000 Å.

In an exemplary embodiment, at least one of side portions of the stopper area may include a plurality of inclined surfaces having inclinations different from each other.

In an exemplary embodiment, the stopper area may further include a flat surface, and the plurality of inclined surfaces may include a first inclined surface extending from the flat surface and a second inclined surface extending from the first inclined surface.

In an exemplary embodiment, an angle between the first inclined surface and the second inclined surface may be about 100° or more and about 135° or less.

In an exemplary embodiment, the light emitting element may have an end disposed on a boundary at which the first inclined surface meets the second inclined surface.

In an exemplary embodiment, the light emitting element may be not in contact with at least a portion of the flat surface of the stopper area.

In an exemplary embodiment, the display device may further include: a first partition disposed between the first insulation layer and the first electrode; and a second partition disposed between the second insulation layer and the second electrode, and the light emitting element may be disposed between the first partition and the second partition.

In an exemplary embodiment of the inventive concept, a method of manufacturing a display device includes: forming a first insulation layer on an insulation surface; forming a conductive layer on the first insulation layer; forming a first electrode and a second electrode by patterning the conductive layer; forming a second insulation layer covering the first electrode, the second electrode, and the first insulation layer disposed between the first electrode and the second electrode; forming a photoresist pattern on the second insulation layer; forming a stopper area by removing a portion of the second insulation layer, which is exposed from the photoresist pattern; providing a light emitting element on the stopper area; and aligning the light emitting element. Here, the stopper area is disposed between the first electrode and the second electrode.

In an exemplary embodiment, the forming of the stopper area may include dry-etching a portion in a thickness direction of the stopper area of the second insulation layer.

In an exemplary embodiment, the second insulation layer may include a first area overlapping the first electrode, a second area overlapping the second electrode, and the stopper area, and the stopper area has a thickness different from that of each of the first area and the second area.

In an exemplary embodiment, the stopper area may include a first side portion and a second side portion, the first side portion may have a first inclined surface and a second inclined surface, which have inclinations different from each other, and the second side portion may have a third inclined surface and a fourth inclined surface, which have inclinations different from each other.

In an exemplary embodiment, the aligning of the light emitting element may include: supplying a voltage to the first electrode and the second electrode; and supplying a voltage to a first external electrode and a second external electrode.

In an exemplary embodiment, the supplying of the voltage to the first external electrode and the second external electrode may include: supplying the voltage to the first external electrode and the second external electrode, which are disposed below the insulation surface; and moving the first external electrode and the second external electrode.

In an exemplary embodiment, the moving of the first external electrode and the second external electrode may include moving the first external electrode and the second external electrode in a repeated manner until a first end of the light emitting element is disposed on a boundary at which the first inclined surface meets the second inclined surface and a second end of the light emitting element is disposed on a boundary at which the third inclined surface meets the fourth inclined surface.

In an exemplary embodiment, the supplying of the voltage to the first external electrode and the second external electrode may include: arranging each of the first external electrode and the second external electrode at a position spaced a predetermined distance from the light emitting element on the insulation surface; and supplying an alternating current voltage to the to the first external electrode and the second external electrode.

In an exemplary embodiment, the supplying of the voltage to the first external electrode and the second external electrode may include: arranging the first external electrode at a position spaced a predetermined distance from the first electrode in a first direction and the second external electrode at a position spaced a predetermined distance from the second electrode in a second direction that is opposite to the first direction; and supplying an alternating current voltage to the first external electrode and the second external electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
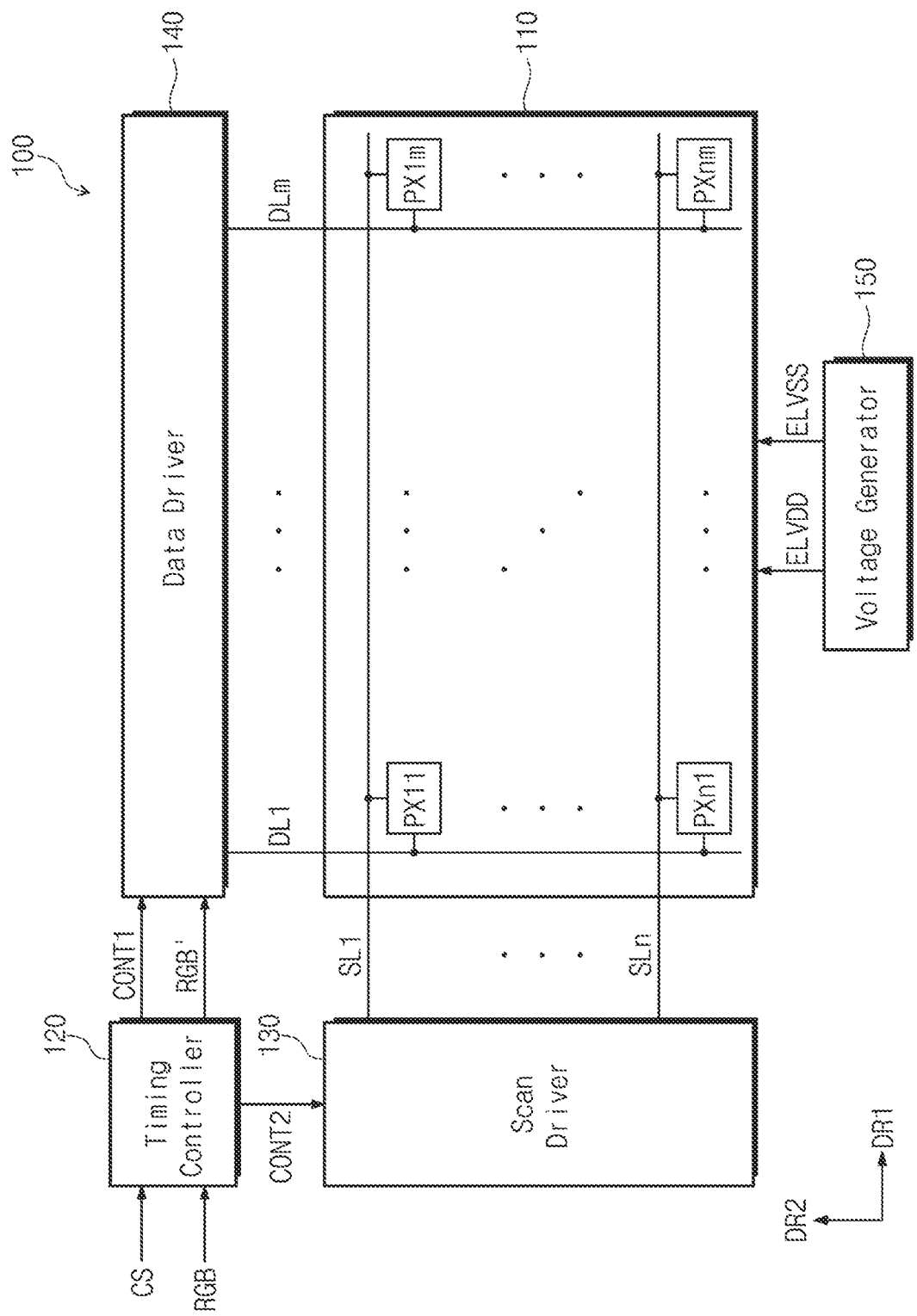
FIG. 1 is a block diagram of a display device according to an embodiment of the inventive concept.

In this specification, it will also be understood that when one component (or region, layer, portion) is referred to as being cony, 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components.

For example, a first element referred to as a first element in one embodiment can be referred to as a second element in another embodiment without departing from the scope of the appended claims. The terms of a singular form may include plural forms unless referred to the contrary.

Also, ""under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

FIG. 1 is a block diagram of a display device according to an embodiment of the inventive concept.

Referring to FIG. 1, a display device 100 may include a display panel 110, a timing controller 120, a scan driver 130, a data driver 140, and a voltage generator 150.

The display panel 110 may include a plurality of data lines DL1 to DLm, a plurality of scan lines SL1 to SLn, and a plurality of pixels PX11 to PXnm.

The plurality of scan lines SL1 to SLn may each extend in a first direction DR1 and be sequentially arranged in a second direction DR2 crossing the first direction DR1. The plurality of data lines DL1 to DLm may each extend in the second direction DR2 and be sequentially arranged in the first direction DR1.

Each of pixels PX11 to PXnm may be connected to a corresponding scan line of the plurality of scan lines SL1 to SLn and a corresponding data line of the plurality of data lines DL1 to DLm. The pixels PX may be arranged according to a predetermined rule on a plane of the display panel 110. Each of the pixels PX11 to PXnm may display one color or a mixed color of primary colors. The primary colors may include red, green, and blue, and the mixed color may include various colors such as yellow, cyan, magenta, and white. In the embodiment, each of the pixels PX11 to PXnm may include a micro light emitting element.

The timing controller 120 receives an input image signal RGB and a control signal CS and outputs a first control signal CONT1, an image data signal RGB', and a second control signal CONT2. The first control signal CONT1 and the image data signal RGB' may be provided to a data driver 140, and the second control signal CONT2 may be provided to a scan driver 130.

The scan driver 130 receives the second control signal CONT2 from the timing controller 120. The scan driver 130 generates a plurality of scan signals and sequentially outputs the plurality of scan signals to the plurality of scan lines SL1 to SLn. The scan driver 130 may include a plurality of thin-film transistors that are provided through the same process as the pixels PX of the display panel 110, e.g., a low temperature polycrystalline silicon (LTPS) process or a low temperature polycrystalline oxide (LTPO) process. Also, the scan driver 130 may be realized as an independent integrated circuit chip and electrically connected to one side of the display panel 110.

The data driver 140 receives the first control signal CONT1 and the image data signal RGB' from the timing controller 120. The data driver 140 converts the image data signal RGB' into data signals and outputs the data signals to the plurality of data lines DL1 to DLm. The data signals are analog voltages corresponding to gray values of image data RGB.

The voltage generator 150 generates a first power voltage ELVDD and a second power voltage ELVSS. The first power voltage ELVDD and the second power voltage ELVSS may be provided to the plurality of pixels PX11 to PXnm of the display panel 110. Although the voltage generator 150 in FIG. 1 generates only the first power voltage ELVDD and the second power voltage ELVSS, the voltage generator 150 may further generate an initialization voltage provided to the plurality of pixels PX11 to PXnm and a power voltage that is necessary for operation of the data driver 140. Also, the voltage generator 150 may further generate a gate clock signal that is necessary for operation of the scan driver 130.

Figure 2:
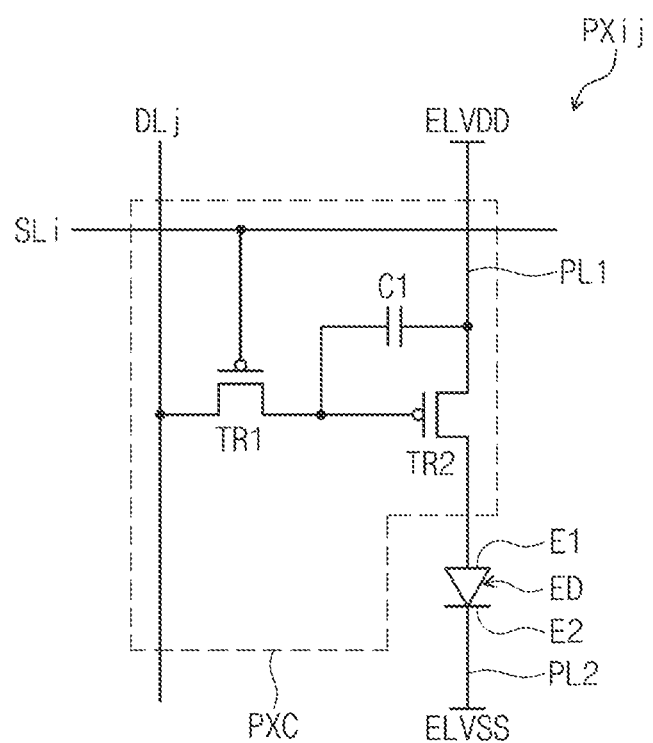
FIG. 2 is an equivalent circuit diagram of a pixel according to an embodiment of the inventive concept.

FIG. 2 is an equivalent circuit diagram of a pixel according to an embodiment of the inventive concept. Although FIG. 2 only illustrates a pixel PXij of the plurality of pixels PX11 to PXnm in FIG. 1, which is connected to an i-th scan line SLi and a j-th data line DLj, each of other pixels may include the same circuit configuration as the pixel PXij.

Referring to FIG. 2, the pixel PXij is connected to the i-th scan line SLi, the j-th data line DLj, a first power line PL1, and a second power line PL2. The pixel PXij according to an embodiment of the inventive concept may be additionally connected to various signal lines. However, the inventive concept is not limited thereto.

The pixel PXij may include a light emitting element ED, a first electrode E1, a second electrode E2, and a pixel circuit PXC. The pixel circuit PXC may include a switching transistor TR1, a driving transistor TR2, and a capacitor C1. Each of the switching transistor TR1 and the driving transistor TR2 may be realized as a thin-film transistor. In another embodiment, the pixel circuit PXC may include a higher number of switching transistors and capacitors. In another embodiment of the inventive concept, the pixel circuit PXC may include seven thin-film transistors and one capacitor.

The switching transistor TR1 may transmit a data signal transmitted through the data line DLj to the driving transistor TR2 in response to a scan signal transmitted through the scan line SLi.

The capacitor C1 charges a charge amount corresponding to a difference between the data signal transmitted from the switching transistor TR1 and the first power voltage ELVDD applied to the first power line PL1.

The driving transistor TR2 controls a driving current flowing through the light emitting element ED in response to a charge amount stored in the capacitor C1. A turn-on time of the driving transistor TR2 may be determined according to the charge amount charged in the capacitor C1.

In this embodiment, each of the switching transistor TR1 and the driving transistor TR2 may be realized as a P-type thin-film transistor. In another embodiment, each of the switching transistor TR1 and the driving transistor TR2 may be realized as an N-type thin-film transistor. Also, in another embodiment, one of the switching transistor TR1 and the driving transistor TR2 may be an N-type thin-film transistor, and the other thereof may be a P-type thin-film transistor.

The light emitting element ED may be connected to the first electrode E1 connected to the driving transistor TR2 and the second electrode E2 connected to the second power line PL2. The second electrode E2 may receive the second power voltage ELVSS through the second power line PL2.

The light emitting element ED may emit light by a voltage corresponding to a difference between the signal transmitted through the driving transistor TR2 and the second power voltage ELVSS received through the second power line PL2.

The light emitting element ED may be a micro light emitting diode (LED) element. The micro LED element may have a length of about several nanometers to several hundred micrometers. However, although the length of the micro LED element is exemplarily described, the inventive concept is not limited to the above-described numerical range of the length of the micro LED element.

Although the one pixel PXij including one light emitting element ED is exemplarily illustrated in FIG. 2, the inventive concept is not limited thereto. For example, the light emitting element ED may be provided in plurality. The plurality of light emitting elements ED may be parallel-connected to each other.

Figure 3A:
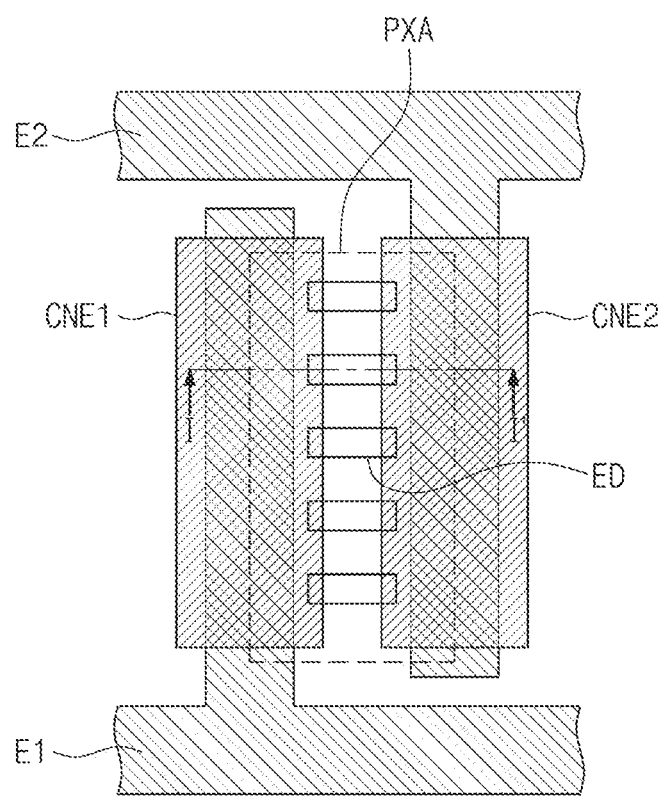
FIG. 3A is a plan view illustrating a display device according to an embodiment of the inventive concept.
Figure 3B:
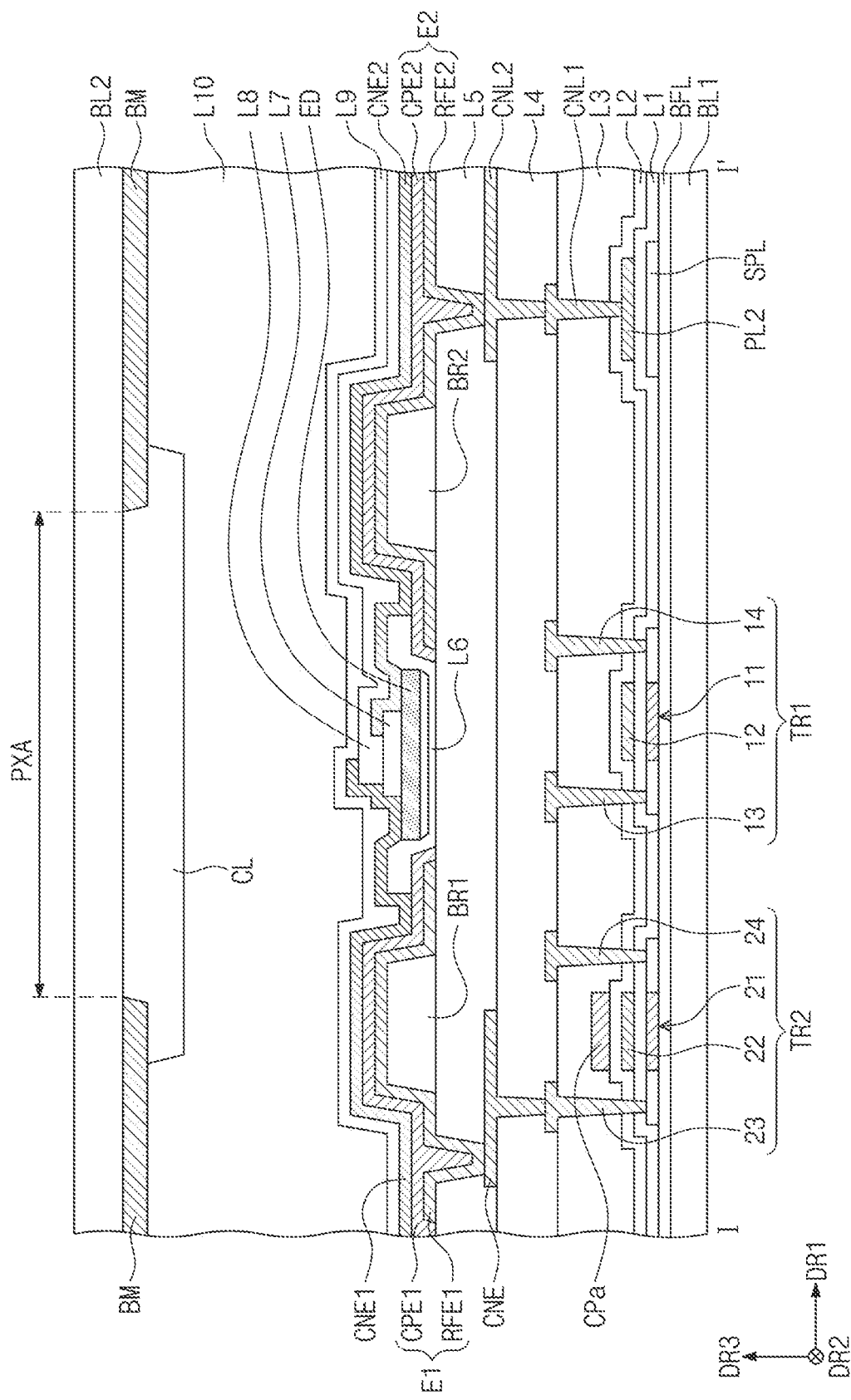
FIG. 3B is a cross-sectional view illustrating the display device according to an embodiment of the inventive concept.

FIG. 3A is a plan view illustrating the display panel according to an embodiment of the inventive concept. FIG. 3B is a cross-sectional view taken along line I-I' of the display panel in FIG. 3A. In FIGS. 3A and 3B, an area corresponding to one pixel is illustrated, and some components are not illustrated.

Referring to FIGS. 3A and 3B, a first base layer BL1 and a second base layer BL2 may face each other. Each of the first base layer BL1 and the second base layer BL2 may be a laminated structure including a silicon substrate, a plastic substrate, a glass substrate, an insulation film, or a plurality of insulation layers.

A buffer layer BFL may be disposed on the first base layer BL1. A switching transistor TR1 and a driving transistor TR2 may be disposed on the buffer layer BFL.

The switching transistor TR1 may include a semiconductor pattern 11, a gate electrode 12, a drain electrode 13, and a source electrode 14. The driving transistor TR2 may include a semiconductor pattern 21, a gate electrode 22, a drain electrode 23, and a source electrode 24.

The semiconductor pattern 11 and the semiconductor pattern 21 may be disposed on the buffer layer BFL. The buffer layer BFL may provide a modified surface to the semiconductor pattern 11 and the semiconductor pattern 21. In this case, the semiconductor pattern 11 and the semiconductor pattern 21 may have a greater adhesion force to the buffer layer BFL than when the semiconductor pattern 11 and the semiconductor pattern 21 are directly provided on the first base layer BL1. Also, the buffer layer BFL may be a barrier layer for protecting a bottom surface of each of the semiconductor pattern 11 and the semiconductor pattern 21. In this case, the buffer layer BFL may block a pollutant or moisture that is generated from or introduced through the first base layer BL1 from being permeated to the semiconductor pattern 11 and the semiconductor pattern 21.

The first insulation layer L1 may be disposed on the buffer layer BFL to cover the semiconductor pattern 11 and the semiconductor pattern 21. The first insulation layer L1 may include an inorganic material. The inorganic material may include, e.g., silicon nitride, silicon oxynitride, silicon oxide, titanium oxide, or aluminum oxide. However, the inventive concept is not limited thereto.

A gate electrode 12 and a gate electrode 22 may be disposed on the first insulation layer L1. A second insulation layer L2 may be disposed on the first insulation layer L1 to cover the gate electrode 12 and the gate electrode 22. The second insulation layer L2 may include an inorganic material.

The capacitor C1 (refer to FIG. 2) may include a first cap electrode (not shown) and a second cap electrode CPa. For example, the first cap electrode may be branched from the gate electrode 22, and the second cap electrode CPa may be disposed on the second insulation layer L2.

A third insulation layer L3 is disposed on the second insulation layer L2 to cover the second cap electrode CPa. A source electrode 14, a drain electrode 13, a source electrode 24, a drain electrode 23, and a first connection line CNL1 may be disposed on the third insulation layer L3. The source electrode 14 and the drain electrode 13 may be connected to the semiconductor pattern 11 through through-holes passing through the first to third insulation layers L1, L2, and L3. The source electrode 24 and the drain electrode 23 may be connected to the semiconductor pattern 21 through the through-holes passing through the first to third insulation layers L1, L2, and L3. The first connection line CNL1 may be connected to the second power line PL2 through the through-holes passing through the first to third insulation layers L1, L2, and L3 On the third insulation layer L3, signal lines, e.g., a portion of each of the scan lines or the data lines, in addition to the source electrode 14, the drain electrode 13, the source electrode 24, and the drain electrode 23 may be disposed.

The fourth insulation layer L4 may be disposed on the third insulation layer L3 to cover the source electrode 14, the drain electrode 13, the source electrode 24, and the drain electrode 23. The fourth insulation layer L4 may include a single layer or a plurality of layers. The fourth insulation layer L4 may include an organic material and/or an inorganic material.

A connection electrode CNE and a second connection line CNL2 may be disposed on the fourth insulation layer L4. On the fourth insulation layer L4, signal lines, e.g., at least another portion of each of the scan lines or the data lines, in addition to the connection electrode CNE and the second connection line CNL2, may be disposed. The connection electrode CNE may be connected to the drain electrode 23. The second connection line CNL2 may be connected to the second power line PL2 through the first connection line CNL1.

A fifth insulation layer L5 may be disposed on the fourth insulation layer L4 to cover the connection electrode CNE and the second connection line CNL2. The fifth insulation layer L5 may include an organic material. The fifth insulation layer L5 covers the pixel circuit PXC (refer to FIG. 2) disposed therebelow.

A first partition BR1 and a second partition BR2 are disposed on the fifth insulation layer L5. The first partition BR1 and the second partition BR2 may be spaced apart from each other in the first direction DR1. For example, each of the first partition BR1 and a second partition BR2 may include an organic material.

The first electrode E1 may cover the first partition BR1, and the second electrode E2 may cover the second partition BR2. That is, the first partition BR1 may be disposed between the first electrode E1 and the fifth insulation layer L5, and the second partition BR2 may be disposed between the second electrode E2 and the fifth insulation layer L5.

A through-hole may be defined in the fifth insulation layer L5, and the connection electrode CNE may be exposed by the through-hole. The first electrode E1 may be electrically connected to the exposed connection electrode CNE. Also, a through-hole may be defined in the fifth insulation layer L5, and the second connection line CNL2 may be exposed by the through-hole. The second electrode E2 may be connected to the second power line PL2 through the second connection line CNL2. That is, the second power voltage ELVSS (refer to FIG. 2) may be provided to the second electrode E2. An auxiliary layer SPL for reducing a stepped portion with a peripheral area may be disposed below the second power line PL2. The auxiliary layer SPL is not an essential component, and thus may be omitted.

The first electrode E1 may include a first reflection electrode RFE1 and a first capping electrode CPE1, and the second electrode E2 may include a second reflection electrode RFE2 and a second capping electrode CPE2.

Each of the first reflection electrode RFE1 and the second reflection electrode RFE2 may include a reflective material. Each of the first reflection electrode RFE1 and the second reflection electrode RFE2 may have a single layer structure or a structure in which a plurality of layer are laminated. For example, each of the first reflection electrode RFE1 and the second reflection electrode RFE2 may have a structure in which indium-tin oxide (ITO), silver (Ag), and indium-tin oxide (ITO) are sequentially laminated.

The first capping electrode CPE1 may cap the first reflection electrode RFE1, and the second capping electrode CPE2 may cap the second reflection electrode RFE2. For example, each of the first capping electrode CPE1 and the second capping electrode CPE2 may include at least one of indium-zinc-oxide (IZO), indium-tin oxide (ITO), indium-gallium oxide (IGO), indium-zinc-gallium oxide (IGZO), and a mixture/compound thereof.

On a plane, a sixth insulation layer L6 is disposed on the fifth insulation layer L5 between the first electrode E1 and the second electrode E2. The sixth insulation layer L6 may cover a portion of the first electrode E1 and a portion of the second electrode E2.

A light emitting element ED is disposed on the sixth insulation layer L6. The light emitting element ED may be disposed between the first electrode E1 and the second electrode E2. The light emitting element ED may be electrically connected to the first electrode E1 and the second electrode E2.

Referring to FIG. 3A, the first electrode E1 and the second electrode E2 are illustrated. Each of the first electrode E1 and the second electrode E2 may extend in the second direction DR2, and the first electrode E1 and the second electrode E2 may be spaced apart from each other in the first direction DR1. Although the first electrode E1 and the second electrode E2 are exemplarily illustrated in FIG. 3A, the inventive concept is not limited thereto. Each of the first electrode E1 and the second electrode E2 may have structures of various other shapes as long as the first electrode E1 and the second electrode E2 are spaced apart from each other.

On a plane, the light emitting element ED may be disposed between the first electrode E1 and the second electrode E2 while not overlapping the first electrode E1 and the second electrode E2. The light emitting element ED may be provided in plurality, and the plurality of light emitting elements may be parallel-connected to each other. The light emitting element ED may be electrically connected to the first electrode E1 by the first connection electrode CNE1 and to the second electrode E2 by the second connection electrode CNE2.

A seventh insulation layer L7 (or insulation pattern) may be disposed on the light emitting element ED. The seventh insulation layer L7 may cover at least a portion of a top surface of the light emitting element ED.

The second connection electrode CNE2 may be disposed on the light emitting element ED and the second electrode E2. An eighth insulation layer L8 may be disposed on the second connection electrode CNE2. The first connection electrode CNE1 may be disposed on the light emitting element ED and the first electrode E1. Although the light emitting element ED has a length of about hundred micrometers or less, the second connection electrode CNE2 and the first connection electrode CNE1 may not contact each other due to the eighth insulation layer L8. However, the inventive concept is not limited thereto. In another embodiment of the inventive concept, the first connection electrode CNE1 and the second connection electrode CNE2 may be simultaneously formed through the same process.

Each of the first connection electrode CNE1 and the second connection electrode CNE2 may include a conductive material. For example, the conductive material may include at least one of indium-zinc-oxide (IZO), indium-tin oxide (ITO), indium-gallium oxide (IGO), indium-zinc-gallium oxide (IGZO), and a mixture/compound thereof. However, the inventive concept is not limited thereto. For example, the conductive material may be a metal material, e.g., molybdenum, silver, titanium, copper, aluminum, or an alloy thereof.

A ninth insulation layer L9 may be disposed on the first connection electrode CNE1 and the eighth insulation layer L8. The ninth insulation layer L9 may be an encapsulation layer.

A light shielding part BM may be disposed on one surface of the second base layer BL2, which faces the first base layer BL1. An opening may be defined in the light shielding part BM, and a wavelength conversion part CL may cover the opening. An area exposed by the opening may correspond to the pixel light emitting area PXA.

The wavelength conversion part CL may include a light emitting material. For example, the light emitting material may absorb first light provided from the light emitting element ED and convert a wavelength of the first light, thereby emitting second light having a color different from that of the first light. The light emitting material may be, e.g., a quantum dot. The first light may be blue light, and the second light may be green light or red light. However, the inventive concept is not limited thereto. In another embodiment of the inventive concept, the wavelength conversion part CL may be replaced by a color filter. The color filter may realize a color by absorbing light having a specific wavelength. In another embodiment of the inventive concept, the wavelength conversion part CL may be omitted. In this case, the light emitting element ED may emit blue light, green light, or red light.

A tenth insulation layer L10 may be disposed between the wavelength conversion part CL and the ninth insulation layer L9. For example, the first base layer BL1 on which the pixel circuit PXC (refer to FIG. 2) and the light emitting element ED are disposed and the second base layer BL2 on which the wavelength conversion part CL and the light shielding part BM are disposed may be coupled to each other by the tenth insulation layer L10. For example, the tenth insulation layer L10 may be an optically clear adhesive film, an optically clear resin, or a pressure sensitive adhesive film. However, the inventive concept is not limited thereto. In another embodiment of the inventive concept, the tenth insulation layer L10 may be omitted.

Figure 4A:
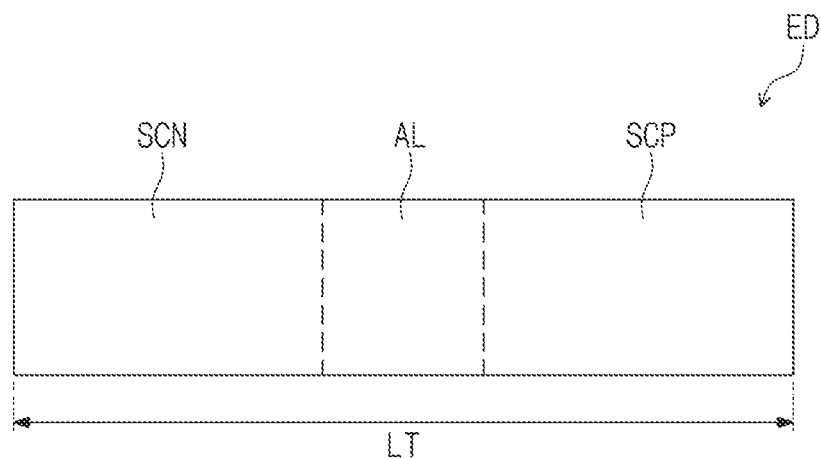
FIG. 4A is a cross-sectional view illustrating a light emitting element according to an embodiment of the inventive concept.

FIG. 4A is a cross-sectional view illustrating a light emitting element according to an embodiment of the inventive concept.

Referring to FIG. 4A, the light emitting element ED may have various shapes such as a circular cylinder shape or a polygonal cylinder shape.

The light emitting element ED may include an N-type semiconductor layer SCN, a P-type semiconductor layer SCP, and an active layer AL. The active layer AL may be disposed between the N-type semiconductor layer SCN and the P-type semiconductor layer SCP.

The N-type semiconductor layer SCN may be provided by doping an N-type dopant in a semiconductor layer, and the P-type semiconductor layer SCP may be provided by doping a P-type dopant in a semiconductor layer. The semiconductor layer may include a semiconductor material, e.g., GaN, AlN, AlGaN, InGaN, InN, InAlGaN, or AlInN. The N-type dopant may be silicon (Si), germanium (Ge), tin (Sn), selenium (Se), tellurium (Te), or a combination thereof. However, the inventive concept is not limited thereto. The P-type dopant may be magnesium (Mg), zinc (Zn), calcium (Ca), strontium (Sr), barium (Ba), or a combination thereof. However, the inventive concept is not limited thereto.

The active layer AL may have at least one of a single-quantum well structure, a multi-quantum well structure, a quantum line structure, or a quantum dot structure. The active layer AL may be an area in which an electron injected through the N-type semiconductor layer SCN and a hole injected through the P-type semiconductor layer SCP are re-coupled to each other. The active layer AL may be a layer emitting light having energy that is determined by the active layer AL's energy band of a material. The active layer AL may be disposed on various positions that are determined according to kinds of diodes.

The N-type semiconductor layer SCN may be connected to one of the first electrode E1 (refer to FIG. 3B) and the second electrode E2 (refer to FIG. 3B), and the P-type semiconductor layer SCP may be connected to the other of the first electrode E1 and the second electrode E2.

The light emitting element ED may be a micro light emitting diode (LED). The light emitting element ED may have a length LT of several nanometers to several hundred micrometers. For example, the light emitting element ED may have a length LT of about 1 µm to about 100 µm.

Figure 4B:
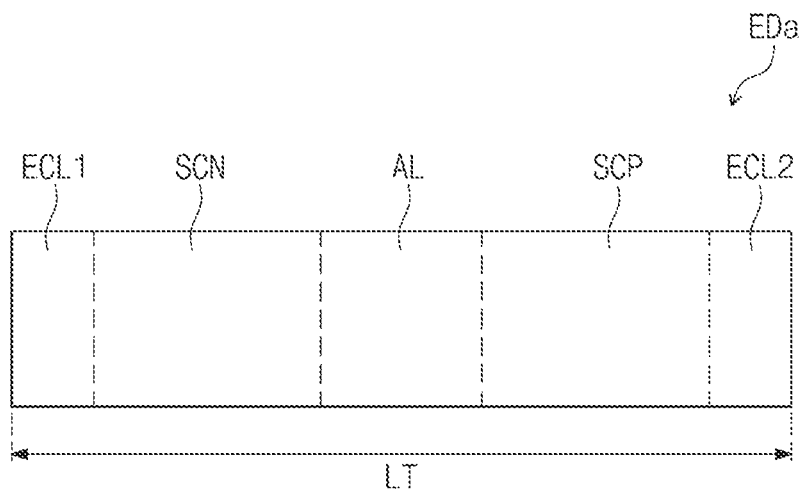
FIG. 4B is a cross-sectional view illustrating a light emitting element according to an embodiment of the inventive concept.

FIG. 4B is a cross-sectional view illustrating a light emitting element according to an embodiment of the inventive concept.

Referring to FIG. 4B, a light emitting element EDa may further includes a first electrode layer ECL1 and a second electrode layer ECL2 in comparison with the light emitting element ED in FIG. 4A.

The first electrode layer ECL1 may be disposed adjacent to an N-type semiconductor layer SCN, and the second electrode layer ECL2 may be disposed adjacent to a P-type semiconductor layer SCP. For example, the first electrode layer ECL1, the N-type semiconductor layer SCN, the active layer AL, the P-type semiconductor layer SCP, and the second electrode layer ECL2 may be sequentially laminated.

Each of the first electrode layer ECL1 and the second electrode layer ECL2 may be made of metal or an alloy thereof. For example, each of the first electrode layer ECL1 and the second electrode layer ECL2 may be made of one selected from the group consisting of molybdenum (Mo), chrome (Cr), nickel (Ni), gold (Au), aluminum (Al), titanium (Ti), platinum (Pt), vanadium (V), tungsten (W), lead (Pd), copper (Cu), rhodium (Rh), and iridium (Ir), or an alloy thereof. The first electrode layer ECL1 and the second electrode layer ECL2 may include the same material as each other or different materials from each other.

Figure 4C:
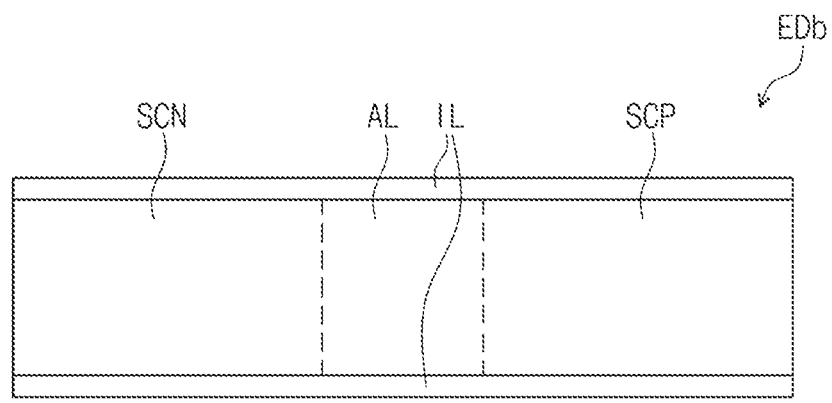
FIG. 4C is a cross-sectional view illustrating a light emitting element according to an embodiment of the inventive concept.

FIG. 4C is a cross-sectional view illustrating a light emitting element according to an embodiment of the inventive concept.

Referring to FIG. 4C, a light emitting element EDb may further include an insulation layer IL in comparison with the light emitting element ED in FIG. 4A. For example, the light emitting element EDb may have a core-shell structure.

The insulation layer IL may cover a N-type semiconductor layer SCN, a P-type semiconductor layer SCP, and an active layer AL to protect an outer surface of each of the N-type semiconductor layer SCN, the P-type semiconductor layer SCP, and the active layer AL In another embodiment of the inventive concept, an insulation layer IL may cover only an active layer SL.

Figure 4D:
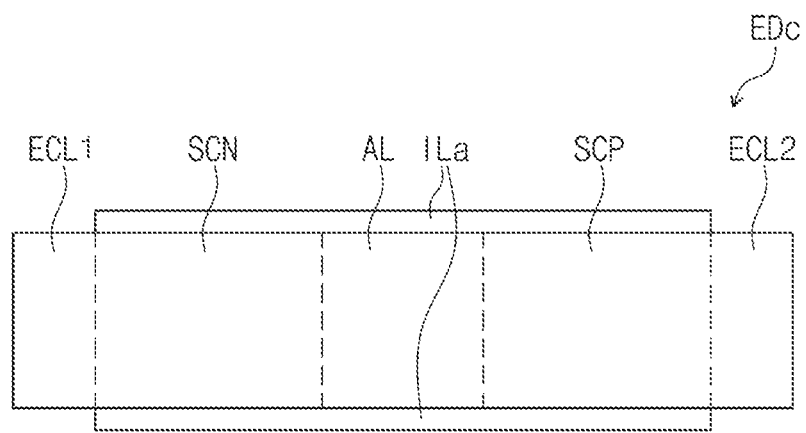
FIG. 4D is a cross-sectional view illustrating a light emitting element according to an embodiment of the inventive concept.

FIG. 4D is a cross-sectional view illustrating a light emitting element according to an embodiment of the inventive concept.

Referring to FIG. 4D, a light emitting element EDc may further include an insulation layer ILa in comparison with the light emitting element EDa in FIG. 4B.

The insulation layer ILa may cover an N-type semiconductor layer SCN, a P-type semiconductor layer SCP, and an active layer AL and may not cover a first electrode layer ECL1 and a second electrode layer ECL2. However, in another embodiment of the inventive concept, the insulation layer ILa may cover at least a portion of each of the first electrode layer ECL1 and the second electrode layer ECL2 or all of the first electrode layer ECL1 and the second electrode layer ECL2.

Figure 5:
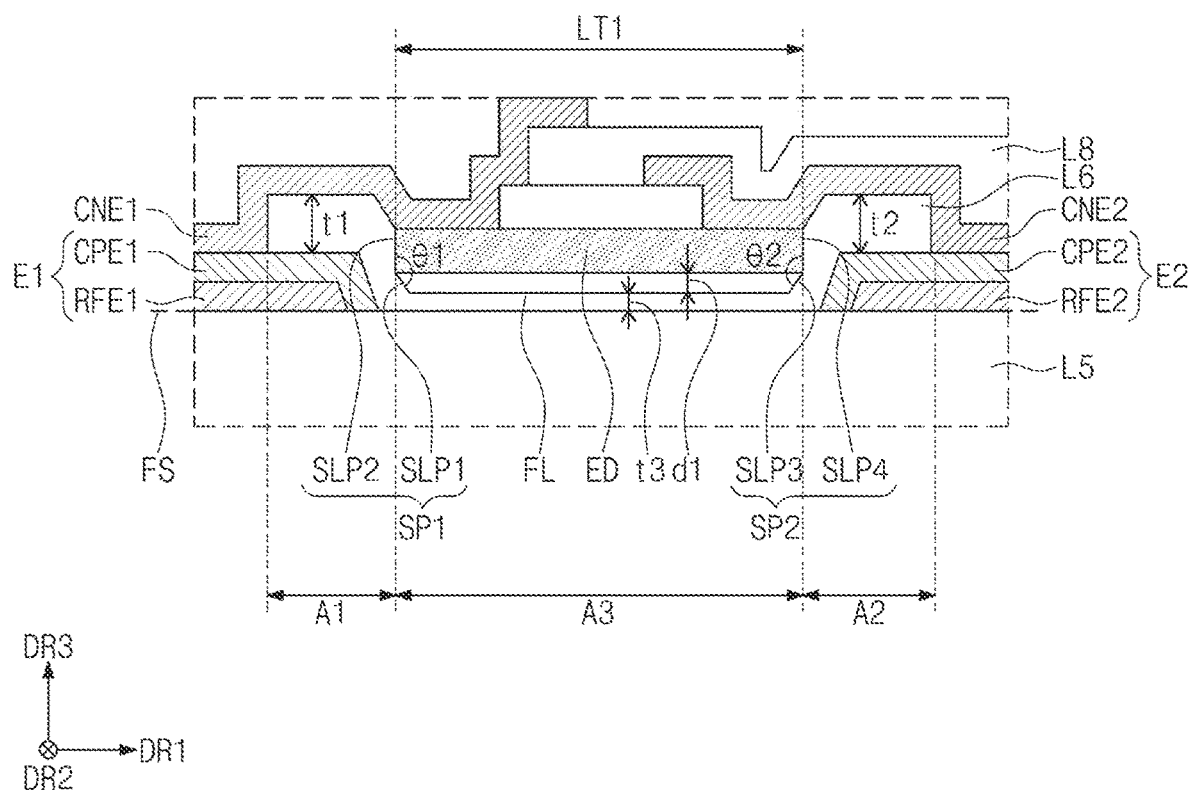
FIG. 5 is an enlarged cross-sectional view illustrating a portion of FIG. 3B.

FIG. 5 is an enlarged cross-sectional view illustrating a portion of FIG. 3B.

Referring to FIG. 5, the sixth insulation layer L6 is provided after the first electrode E1 and the second electrode E2 are provided. When viewed from the third direction DR3, the sixth insulation layer L6 includes a first area A1 overlapping the first electrode E1, a second area A2 overlapping the second electrode E2, and a third area A3 disposed between the first area A1 and the second area A2. In an embodiment, the third area A3 may be disposed between the first electrode E1 and the second electrode E2. In this embodiment, the third area A3 may be referred to as a stopper area for alignment of the light emitting element ED.

The stopper area A3 may have a width in the first direction DR1, which is equal to or greater than that of the light emitting element ED in the first direction DR1. For example, when the light emitting element ED has a length LT1 of about 3.5 µm, the stopper area A3 may have a width of about 3.5 µm or more in the first direction DR1. Accordingly, when viewed from a plane, the light emitting element ED may be disposed in the stopper area A3 of the sixth insulation layer L6, and aligned so that the length LT1 of the light emitting element ED is parallel to a direction in which the first electrode E1 and the second electrode E2 are spaced apart from each other while being disposed in the stopper area A3.

The stopper area A3 has a width in the third direction DR3, i.e., third thickness t3, and the third thickness t3 is different from each of a first thickness t1 of the first area A1 and a second thickness t2 of the second area A2. The first thickness t1, the second thickness t2, and the third thickness t3 may represent minimum thicknesses of the first area A1, the second area A2, and the third area A3, respectively. In other words, a thickness of the sixth insulation layer L6 may represent a distance between a bottom surface and a top surface of the sixth insulation layer L6, which are substantially parallel to each other. Here, a term of minimum thickness is used herein because a thickness may not be completely uniform due to a limitation of a manufacturing process, and a relatively thick portion may exist due to curvatures of layers.

In this embodiment, the first thickness t1 of the first area A1 is substantially the same as the second thickness t2 of the second area A2. However, the inventive concept is not limited thereto. In another embodiment, the first thickness t1 of the first area A1 may be different from the second thickness t2 of the second area A2.

Also, in this embodiment, the third thickness t3 of the stopper area A3 may be less than each of the first thickness t1 of the first area A1 and the second thickness t2 of the second area A2. For example, each of the first thickness t1 of the first area A1 and the second thickness t2 of the second area A2 may be about 5000 Å, and the third thickness t3 of the stopper area A3 may be about 2000 Å. In an embodiment, a difference (t1−t3) between the first thickness t1 and the third thickness t3 may be about 3000 Å or more.

The stopper area A3 has a top surface including a first inclined portion SP1, a second inclined portion SP2, and a flat surface FL. The first inclined portion SP1 may be disposed at one side toward the first electrode E1 of the stopper area A3, and the second inclined portion SP2 may be disposed at one side toward the second electrode E2 of the stopper area A3.

The first inclined portion SP1 includes a first inclined surface SLP1 and a second inclined surface SLP2. The first inclined surface SLP1 may have a first inclination with respect to the flat surface FL, and the second inclined surface SLP2 may have a second inclination with respect to the flat surface FL. In an embodiment, a first angle θ1 between the first inclined surface SLP1 and the second inclined surface SLP2 may be about 100° or more and about 135° or less.

The second inclined portion SP2 includes a third inclined surface SLP3 and a fourth inclined surface SLP4. The third inclined surface SLP3 may have a third inclination with respect to the flat surface FL, and the fourth inclined surface SLP4 may have a fourth inclination with respect to the flat surface FL. In an embodiment, a second angle θ2 between the third inclined surface SLP3 and the fourth inclined surface SLP4 may be about 100° or more and about 135° or less. In this embodiment, the first angle θ1 and the second angle θ2 may be substantially the same as each other.

The light emitting element ED may have a first end disposed on a boundary at which the first inclined surface SLP1 and the second inclined surface SLP2 of the first inclined portion SP1 meet each other and a second end disposed on a boundary at which the third inclined surface SLP3 and the fourth inclined surface SLP4 of the second inclined portion SP2 meet each other. That is, in a cross-section, at least a portion of the light emitting element ED may be disposed on the flat surface FL of the sixth insulation layer L6. In this embodiment, the light emitting element ED may not contact the flat surface FL of the sixth insulation layer L6. A spaced distance dl between the light emitting element ED and the flat surface FL may be varied according to a length and an inclination of each of the first inclined surface SLP1 and the third inclined surface SLP3. In another embodiment, the light emitting element ED may contact a portion of the flat surface FL of the sixth insulation layer L6. Also, when viewed from a plane, the light emitting element ED may not contact the first electrode E1 and the second electrode E2.

According to an embodiment of the inventive concept, since the stopper area A3 is provided between the first electrode E1 and the second electrode E2, the light emitting element ED may be accommodated in the stopper area A3. Accordingly, the light emitting element ED may further be easily aligned.

Each of the second inclined surface SLP2 and the fourth inclined surface SLP4 may be perpendicular to the flat surface FL. Each of the second inclined surface SLP2 and the fourth inclined surface SLP4 may have a length that is the same as a maximum thickness in a direction perpendicular to the length LT1 of the light emitting element ED. For example, when the light emitting element ED has a circular cylinder shape, the light emitting element ED may have a thickness corresponding to a diameter of the light emitting element ED.

FIGS. 6A to 6L are views illustrating a portion of a process of manufacturing a display device according to an embodiment of the inventive concept. FIGS. 6A to 6L are views illustrating a portion of a process of manufacturing the display panel in FIG. 3B. Description on the same components as those described with reference to FIG. 3B will be omitted.

Figure 6A:
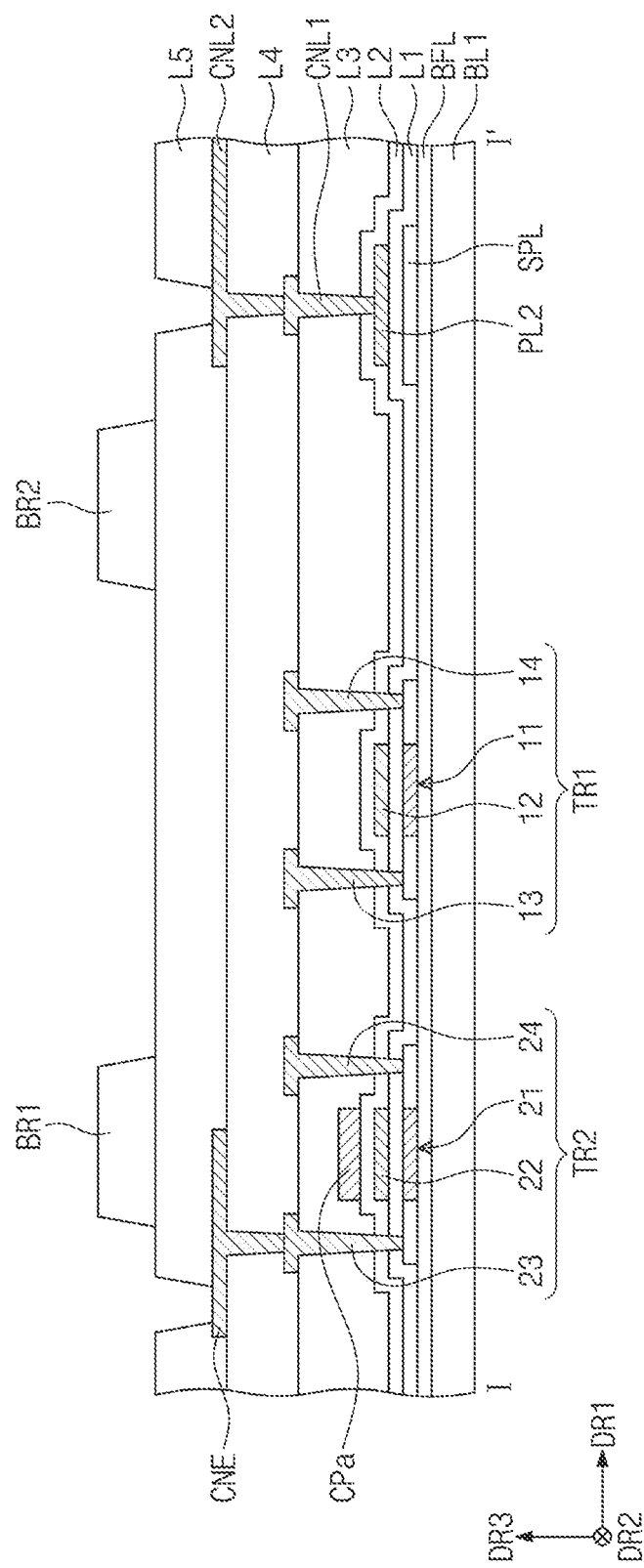
FIGS. 6A, 6B, 6C, 6D, 6E, 6F, 6G, 6H, 6I, 6J, 6K, and 6L are views illustrating a portion of a process of manufacturing a display device according to an embodiment of the inventive concept.

Referring to FIG. 6A, a first base layer BL1 is prepared. Although not separately shown, in a manufacturing process, the first base layer BL1 may be disposed on a working substrate (not shown). The working substrate may be removed after a display panel is manufactured.

A pixel circuit PXC (refer to FIG. 2) including a switching transistor TR1 and a driving transistor TR2 may be formed on the first base layer BL1. The switching transistor TR1 may include a semiconductor pattern 11, a gate electrode 12, a drain electrode 13, and a source electrode 14. The driving transistor TR2 may include a semiconductor pattern 21, a gate electrode 22, a drain electrode 23, and a source electrode 24.

A fifth insulation layer L5 may be formed on the pixel circuit PXC. The fifth insulation layer L5 may include an organic material. The fifth insulation layer L5 may provide a planarized surface. A first partition BR1 and a second partition BR2 are formed on the fifth insulation layer L5.

Figure 6B:
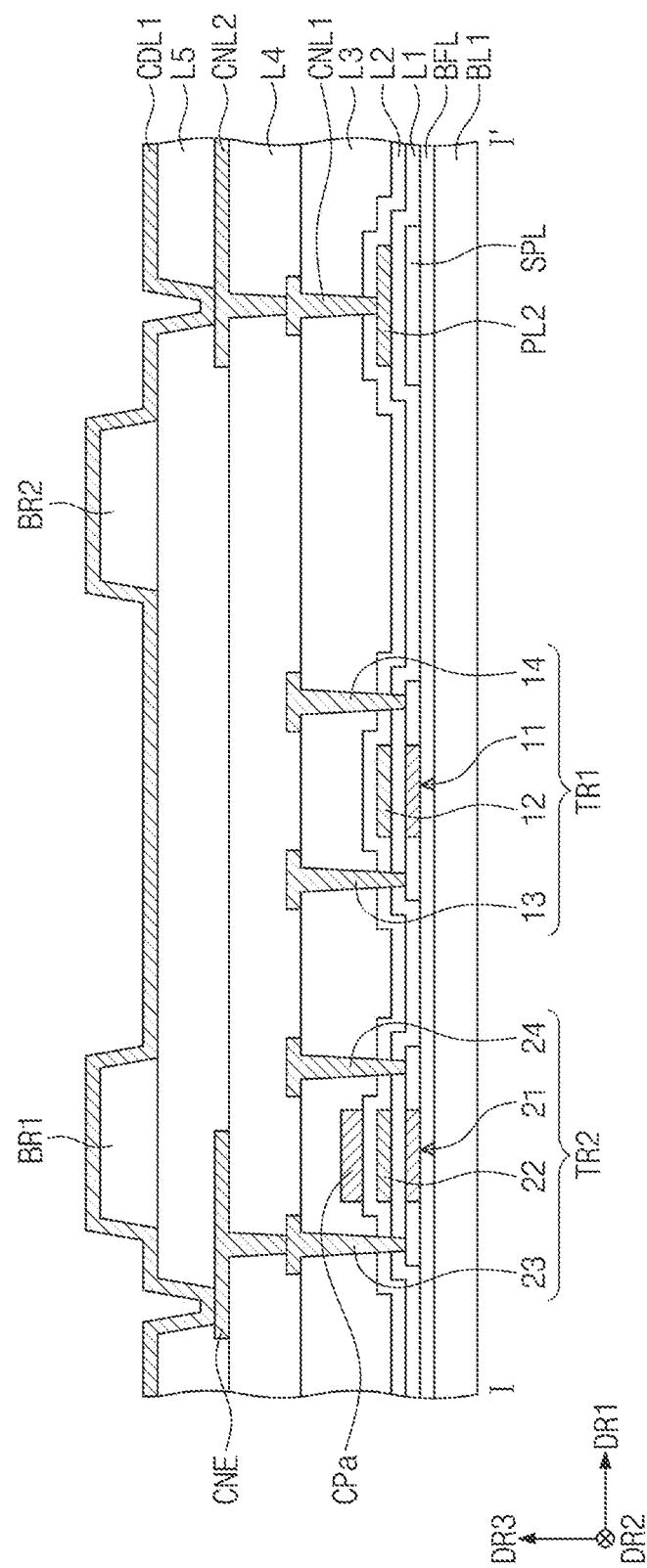

Referring to FIG. 6B, a first conductive layer CDL1 covering the first partition BR1 and the second partition BR2 is formed on the fifth insulation layer L5. The first conductive layer CDL1 may include a plurality of conductive layers. For example, the first conductive layer CDL1 may be formed by sequentially laminating indium-tin oxide (ITO), silver (Ag), and indium-tin oxide (ITO).

Figure 6C:
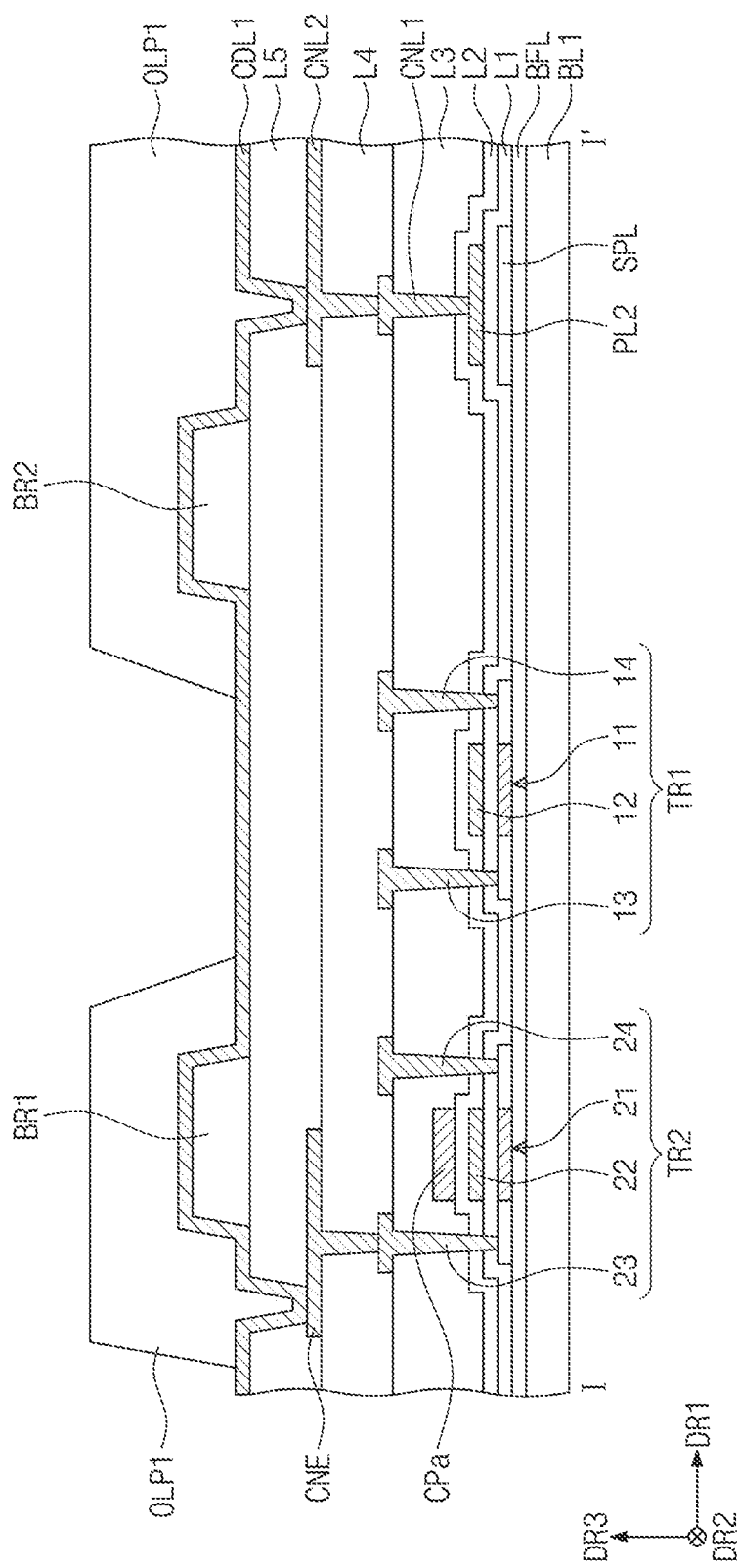

Referring to FIG. 6C, a first photoresist pattern OLP1 is formed on the first conductive layer CDL1. The first photoresist pattern OLP1 may be formed by forming a positive photoresist layer or a negative photoresist layer and then patterning the same. For example, the patterning may include an exposure process and a developing process.

Figure 6D:
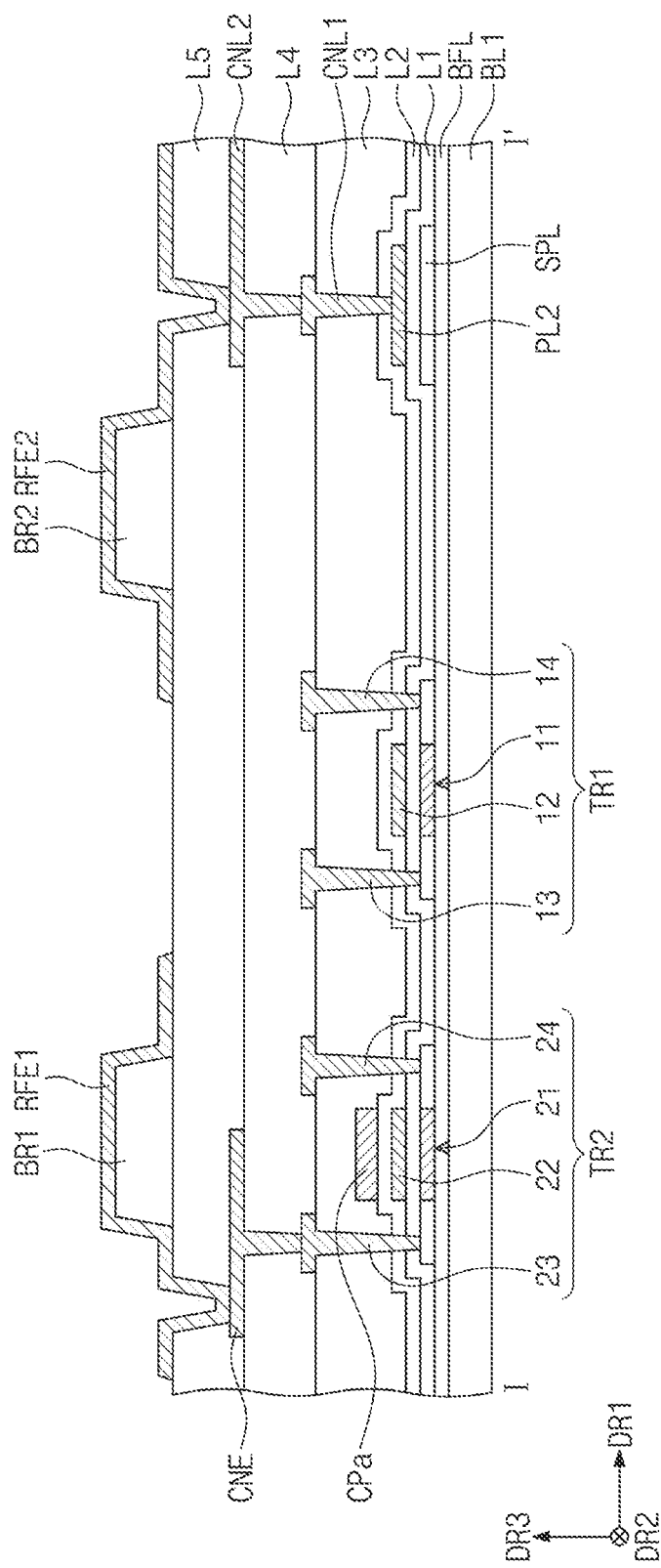

Referring to FIGS. 6C and 6D, a portion of the first conductive layer CDL1, which is exposed from the first photoresist pattern OLP1, is removed. For example, a portion of the first conductive layer CDL1 may be removed by wet-etching the portion of the first conductive layer CDL1.

When the portion of the first conductive layer CDL1 is removed, a first reflection electrode RFE1 and a second reflection electrode RFE2 are formed. The first reflection electrode RFE1 and the second reflection electrode RFE2 are formed, and then the first photoresist pattern OLP1 is removed.

Figure 6E:
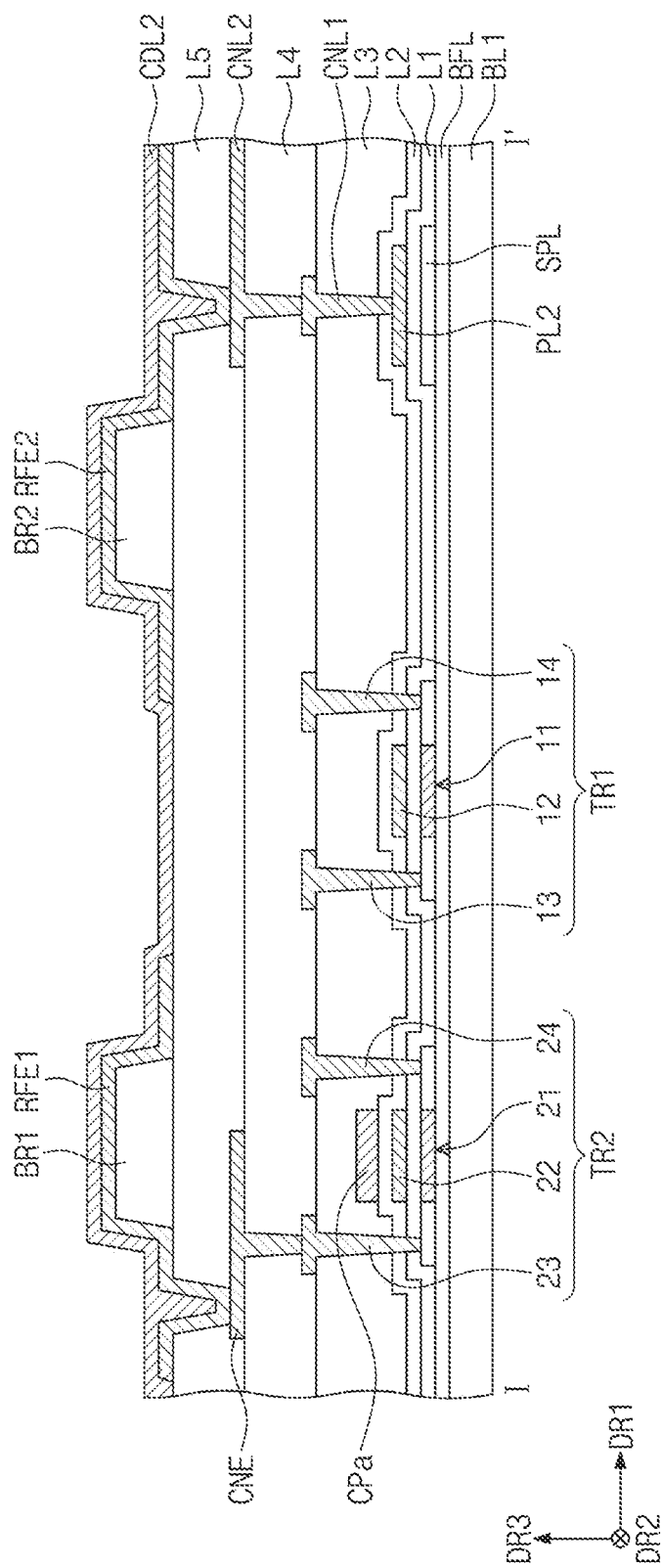

Referring to FIG. 6E, a second conductive layer CDL2 covering the first reflection electrode RFE1 and the second reflection electrode RFE2 is formed. The second conductive layer CDL2 may include at least one of indium-zinc-oxide (IZO), indium-tin oxide (ITO), indium-gallium oxide (IGO), indium-zinc-gallium oxide (IGZO), and a mixture/compound thereof.

Figure 6F:
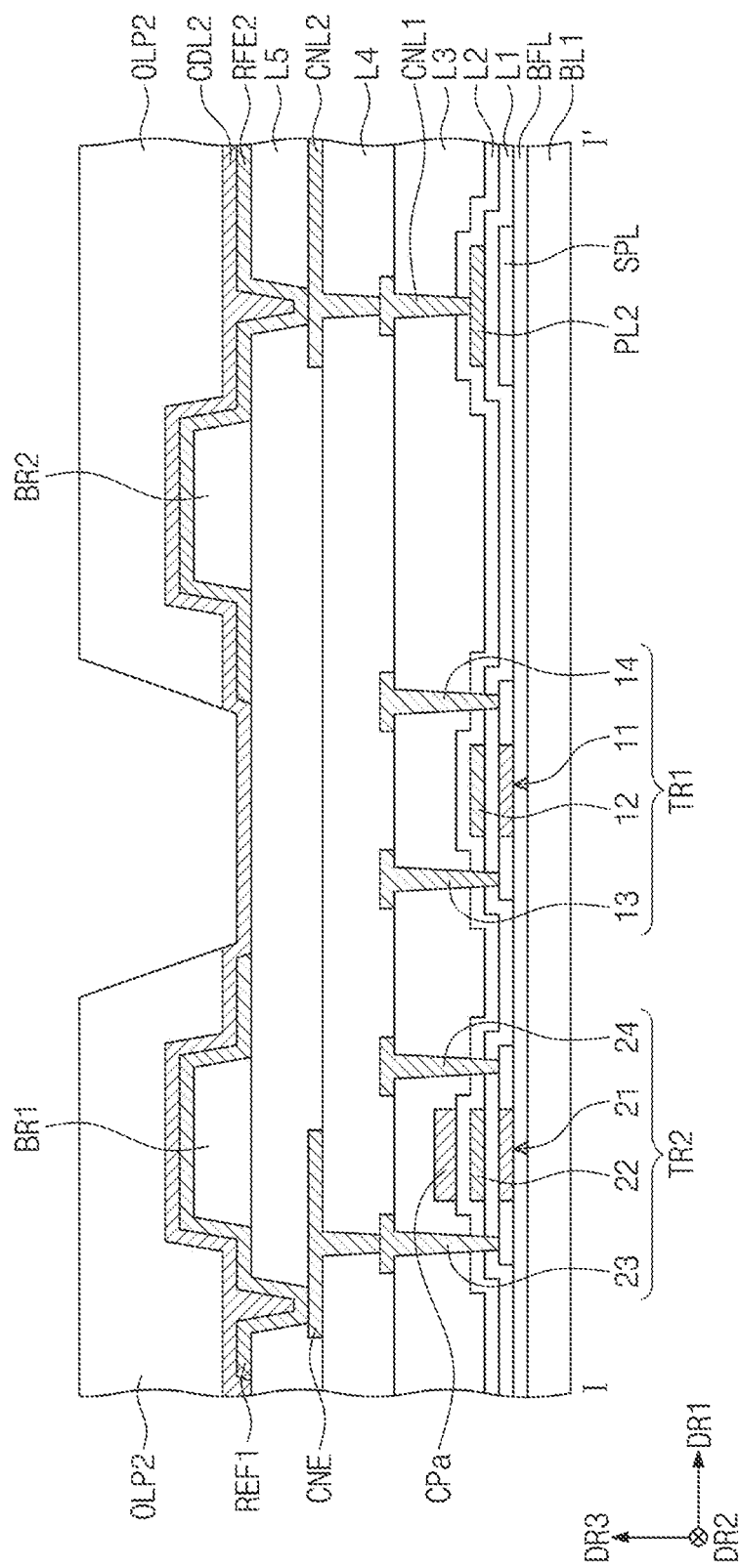
Figure 6G:
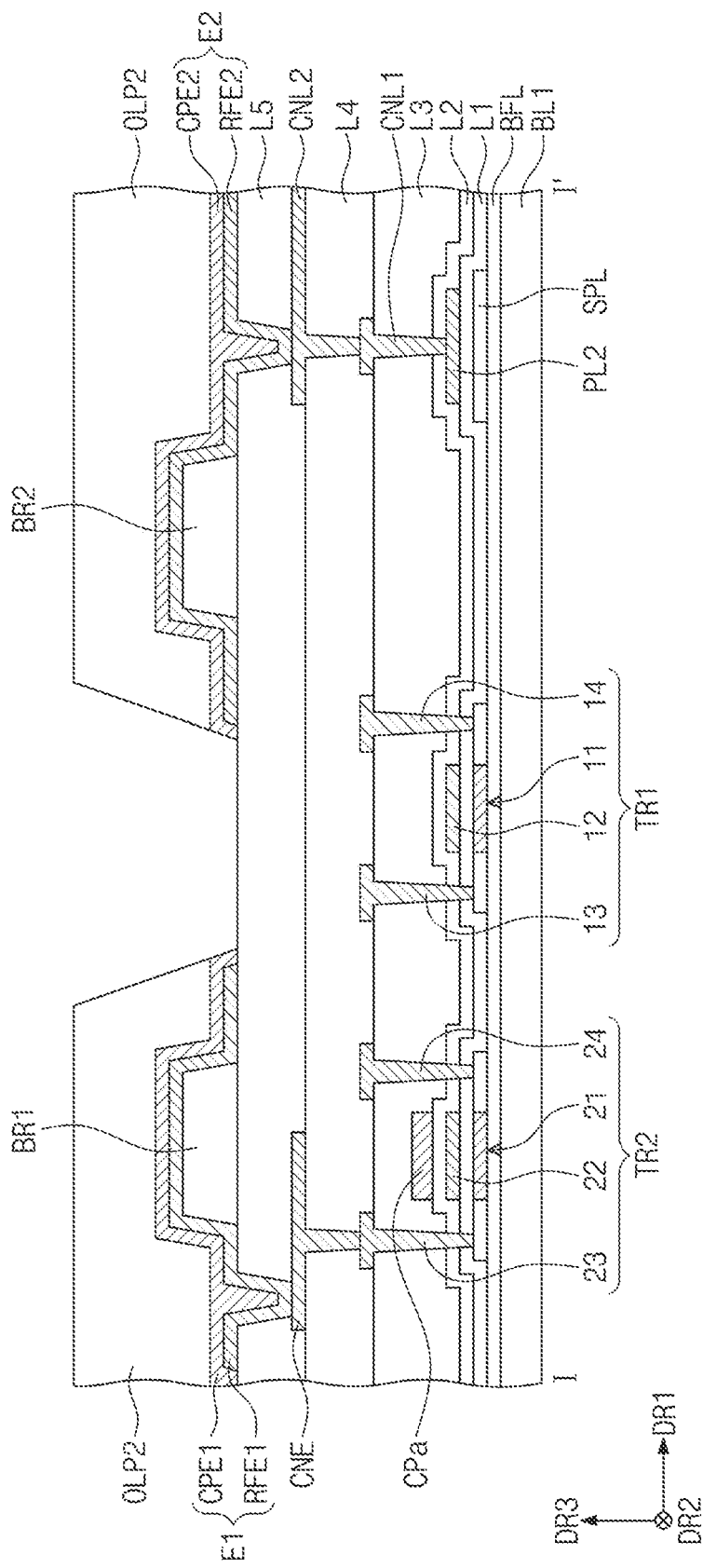

Referring to FIGS. 6F and 6G, a second photoresist pattern OLP2 is formed on the second conductive layer CDL2. The second photoresist pattern OLP2 may be formed by forming a positive photoresist layer or a negative photoresist layer and then patterning the same. For example, the patterning may include an exposure process and a developing process.

A portion of the second conductive layer CDL2, which is exposed from the second photoresist pattern OLP2, is removed. For example, a portion of the second conductive layer CDL2 may be removed by wet-etching the portion of the first conductive layer CDL2. When the portion of the second conductive layer CDL2 is removed, a first capping electrode CPE1 and a second capping electrode CPE2 are formed.

Figure 6H:
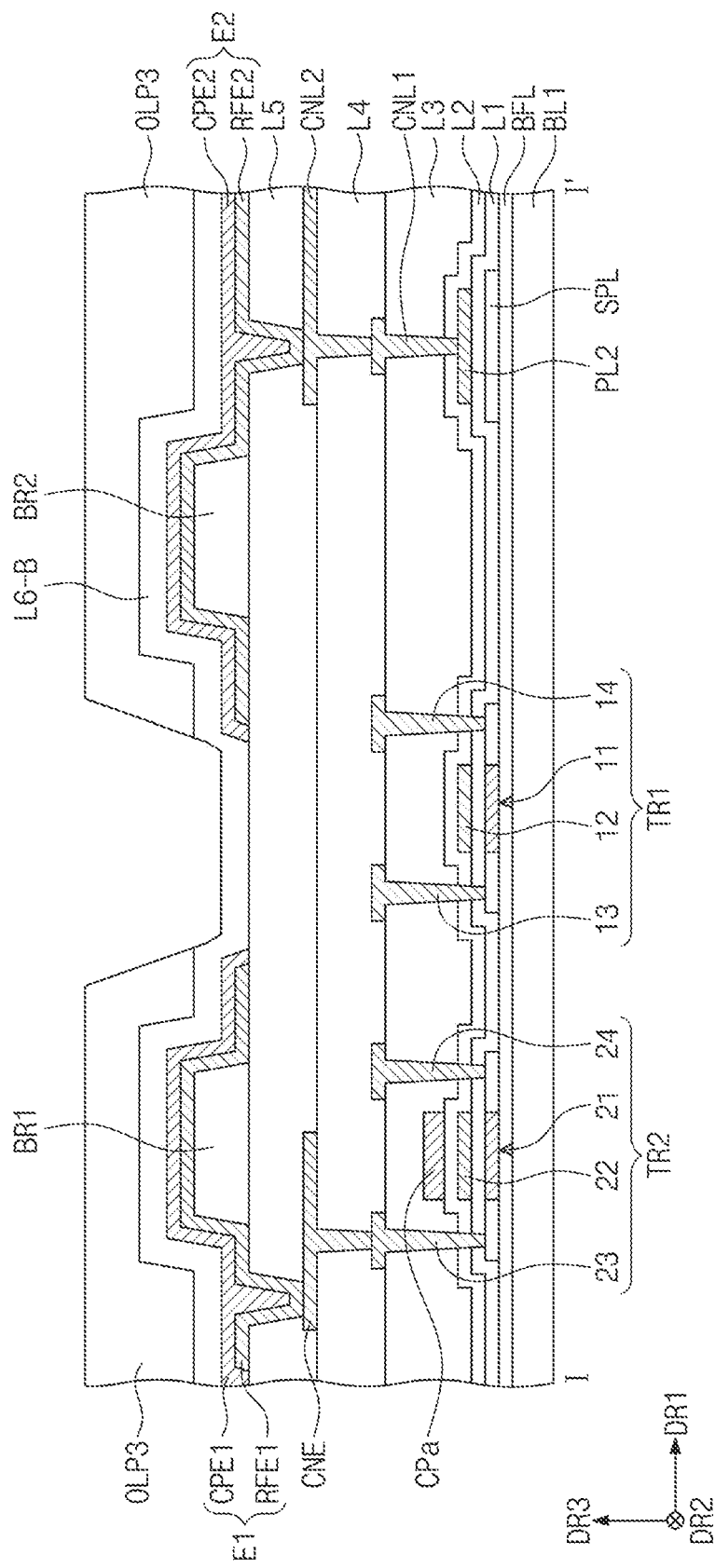

Referring to FIG. 6H, the second photoresist pattern OLP2 is removed, and then a sixth insulation layer L6-B covering the first capping electrode CPE1 and the second capping electrode CPE2 is formed. The sixth insulation layer L6-B may include an inorganic material. For example, the sixth insulation layer L6-B may be made of silicon nitride. In this embodiment, the sixth insulation layer L6-B may have a thickness of about 5000 Å.

A third photoresist pattern OLP3 is formed on the sixth insulation layer L6-B. The third photoresist pattern OLP3 may be formed by forming a positive photoresist layer or a negative photoresist layer and then patterning the same. For example, the patterning may include an exposure process and a developing process.

A portion of the sixth insulation layer L6-B, which is exposed from the third photoresist pattern OLP3, is removed. For example, a portion of the sixth insulation layer L6-B may be removed by wet-etching or dry-etching the portion of the sixth insulation layer L6-B.

Figure 6I:
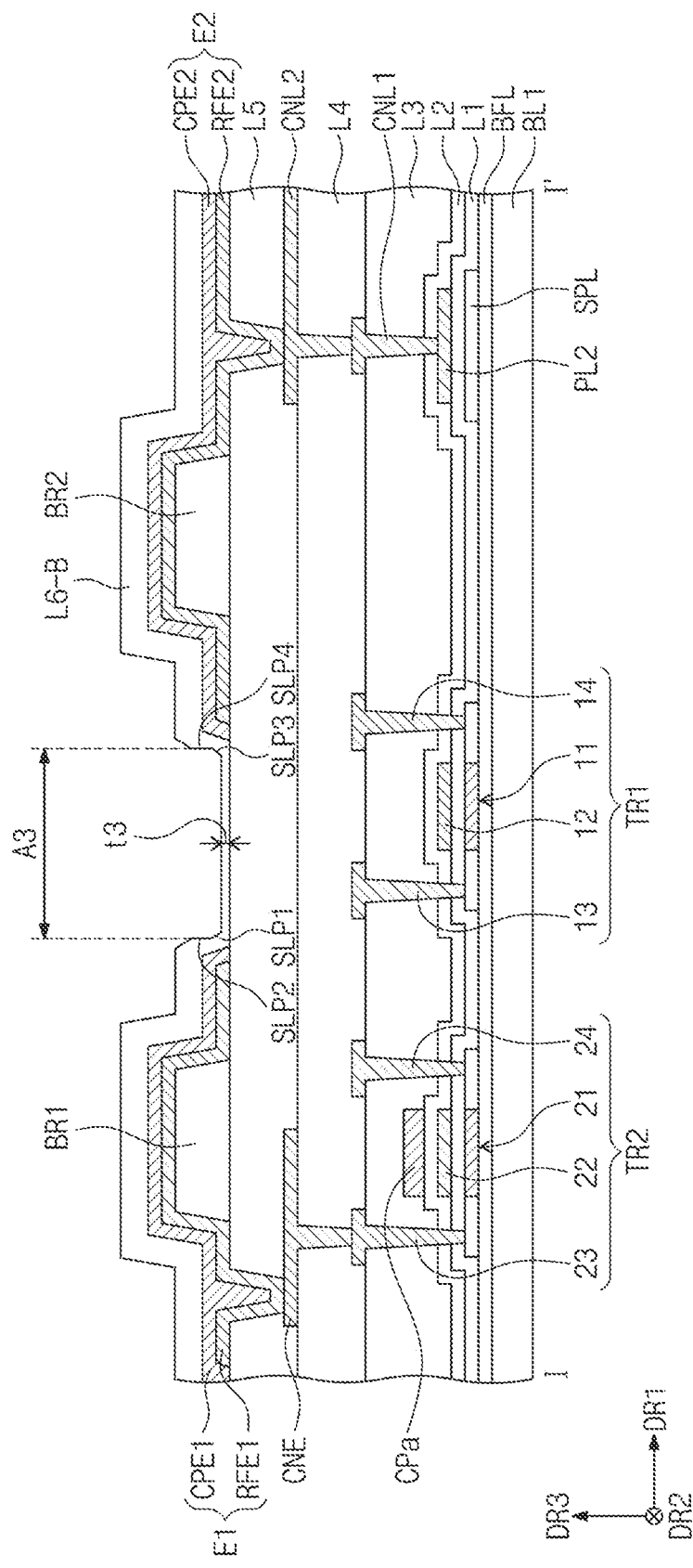

Referring to FIG. 6I, the third photoresist pattern OLP3 is removed, and then a stopper area A3 is formed on the sixth insulation layer L6-B. A third thickness t3 of the stopper area A3 and an inclination of each of the inclined surfaces SP1 to SP4 may be determined by varying an etching degree of the sixth insulation layer L6-B. To vary the etching degree, a halftone mask or a plurality of masks may be used. However, the inventive concept is not limited to the above-described method for varying the etching degree. The third thickness t3, which is a minimum thickness of the stopper area A3, may be about 2000 Å.

Figure 6J:
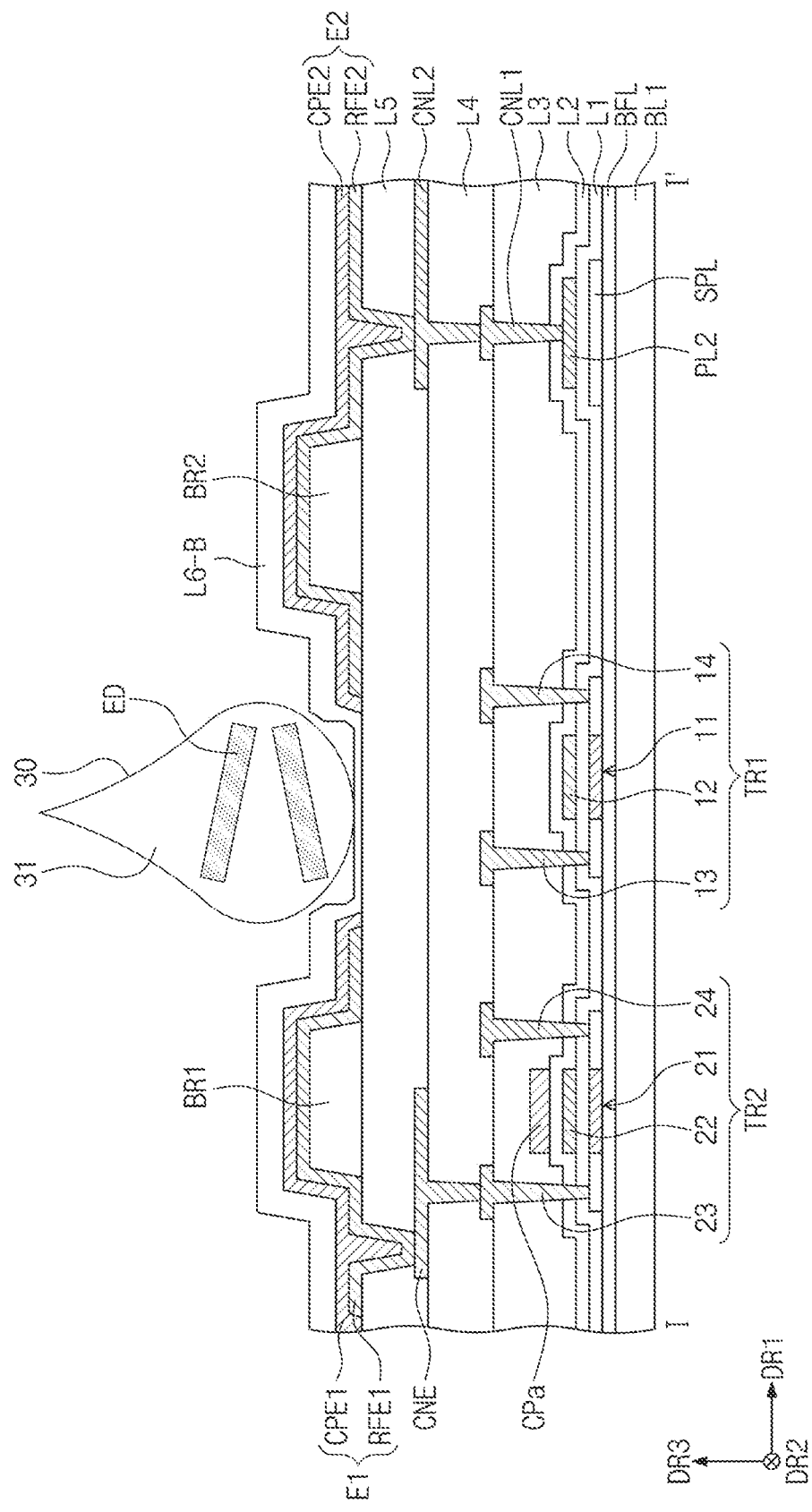
Figure 6K:
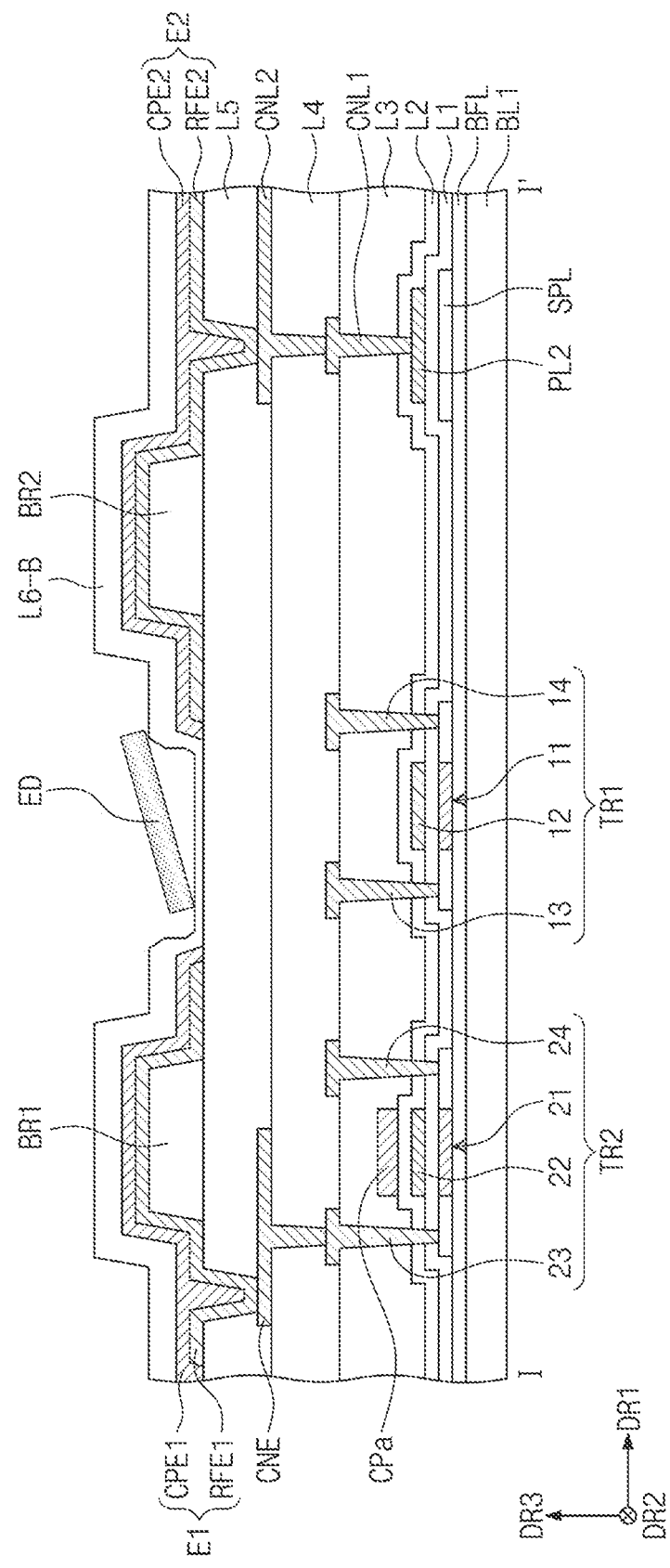

Referring to FIGS. 6J and 6K, a solution 30 containing the light emitting element ED may be applied on the stopper area A3 between the first electrode E1 and the second electrode E2. A solvent 31 of the solution 30 may include at least one of acetone, water, isopropyl alcohol (IPA), and toluene. However, the inventive concept is not limited thereto. For example, the solvent 31 may include various materials each having volatility.

Power is applied to the first electrode E1 and the second electrode E2 to form an electric field therebetween. Dipolarity may be induced to the light emitting element ED by the electric field, and the light emitting element ED may be aligned between the first electrode E1 and the second electrode E2 by an electrophoresis force. Also, the light emitting element ED may further be conveniently located between the first electrode E1 and the second electrode E2 by the first inclined portion SP1 and the second inclined portion SP2 of the stopper area A3. Accordingly, an alignment degree of the light emitting element ED may further improve.

Figure 6L:
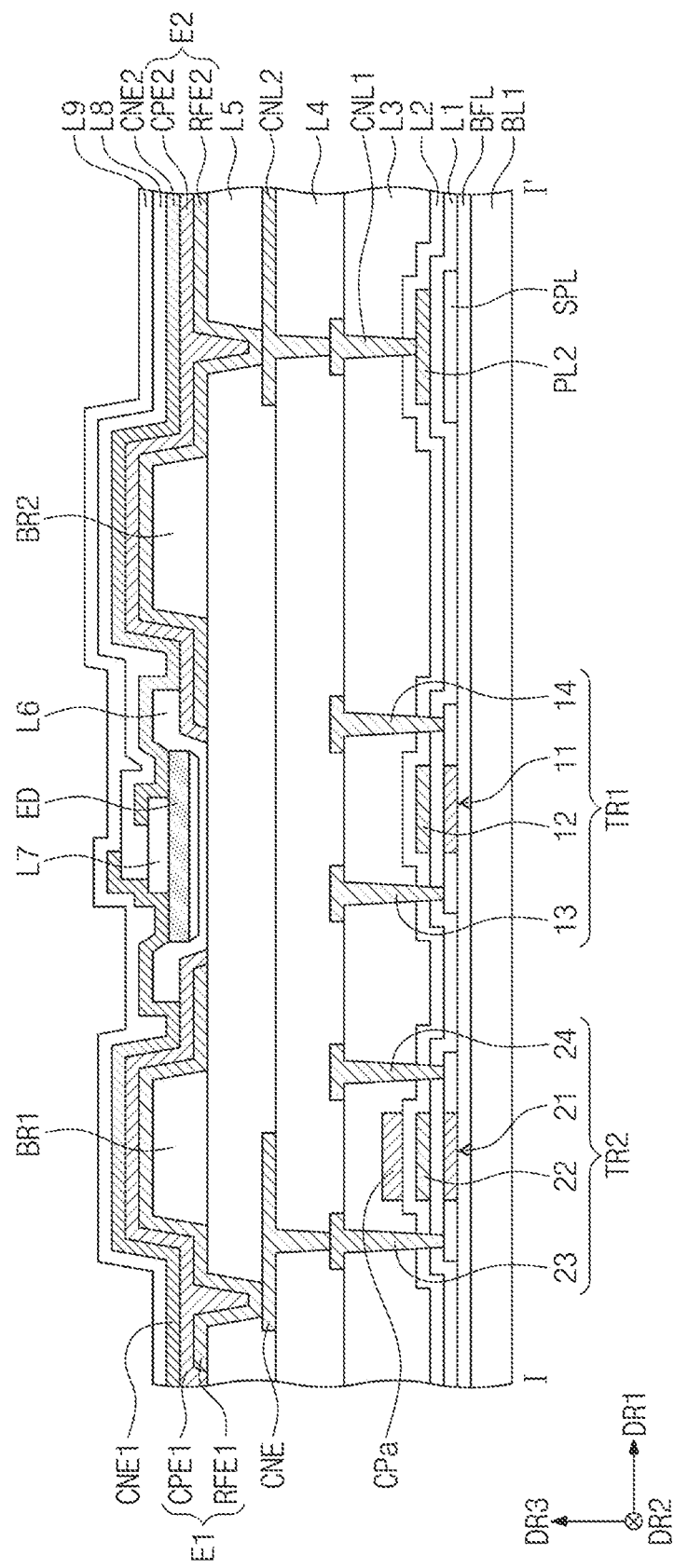

Referring to FIG. 6L, an insulation pattern L7 is formed on the light emitting element ED, and the sixth insulation layer L6-B is patterned. For example, a sixth insulation layer L6 is formed by removing a portion of the sixth insulation layer L6-B, which is disposed on the first electrode E1 and the second electrode E2. Thereafter, a second connection electrode CNE2, an eighth insulation layer L8, a first connection electrode CNE1, and a ninth insulation layer L9 are formed in order.

FIGS. 7A to 7D are views for explaining a method of aligning the light emitting element.

Figure 7A:
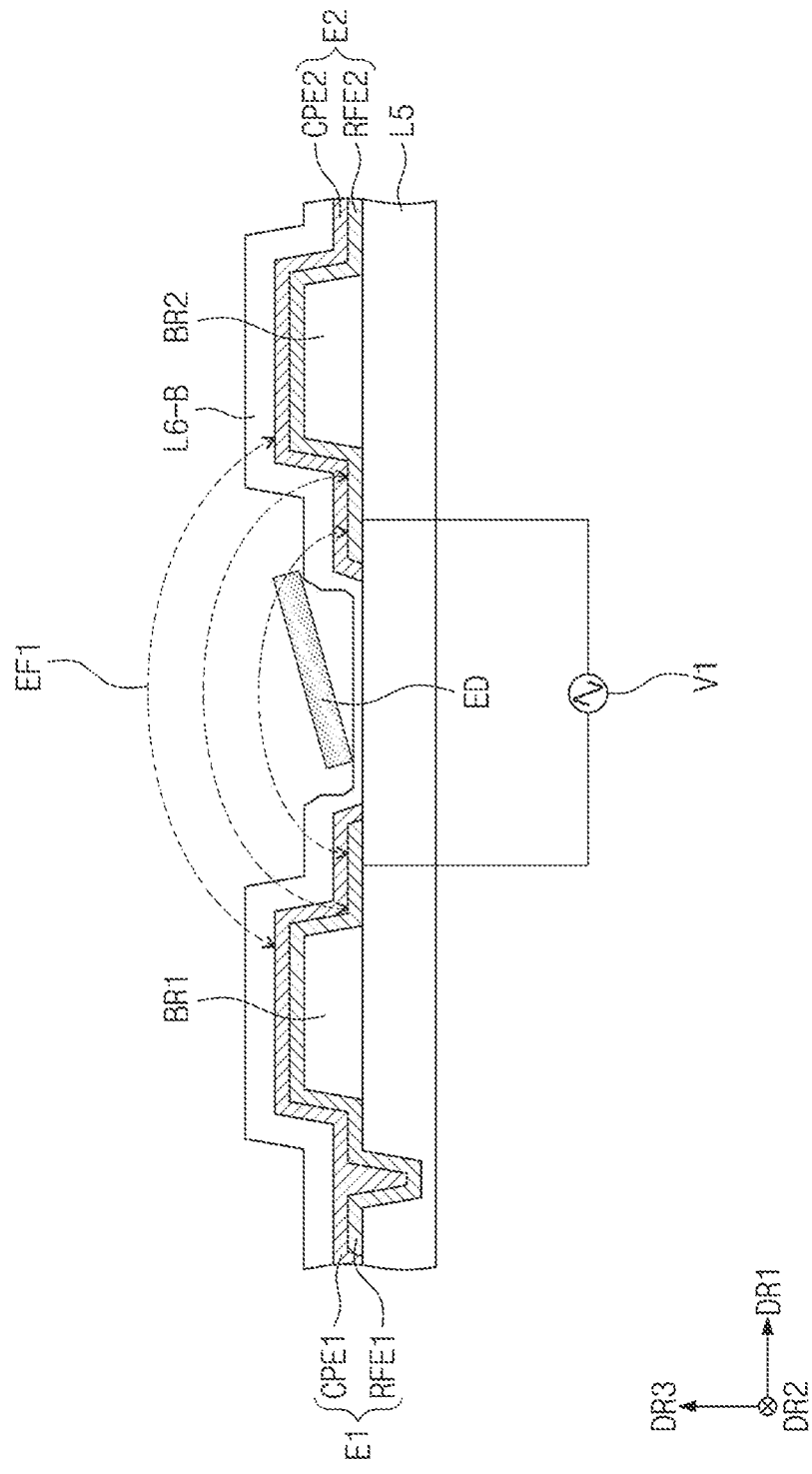
FIGS. 7A, 7B, 7C, and 7D are view for explaining a method of aligning a light emitting element.

Referring to FIG. 7A, an electric field EF1 may be formed between the first electrode E1 and the second electrode E2 by applying a first voltage V1 therebetween. The first voltage V1 may be a voltage generated by a voltage generator 150 in FIG. 1 or a voltage provided from an external supply source. The first voltage V1 is an alternating current voltage having a predetermined amplitude and frequency. In this embodiment, the first voltage V1 may be an alternating current voltage of about ±20V and about 100 kHz.

In another embodiment, the first voltage V1 may be a direct current voltage. When the first voltage V1 is a direct current voltage, as voltages having opposite polarities are repeatedly applied to the first electrode E1 and the second electrode E2, a power having a predetermined amplitude and frequency may be realized.

When the first voltage V1 is applied to the first electrode E1 and the second electrode E2, a potential difference may be generated due to electrical polarities applied to the first electrode E1 and the second electrode E2 to form an electric field. As dipolarity is induced to the light emitting element ED under the ununiform electric field EF1, the light emitting element ED may receive a force in a direction in which an inclination of electricity is greater or less by a dielectrophoretic (DEP) force. As described above, the light emitting element ED may be aligned at a desired position while the first voltage V1 is supplied to the first electrode E1 and the second electrode E2. However, when the light emitting element ED is disposed biased to one of the first electrode E1 and the second electrode E2, the light emitting element ED may not be aligned at the desired position by only the electric field formed by the first voltage V1.

Figure 7B:
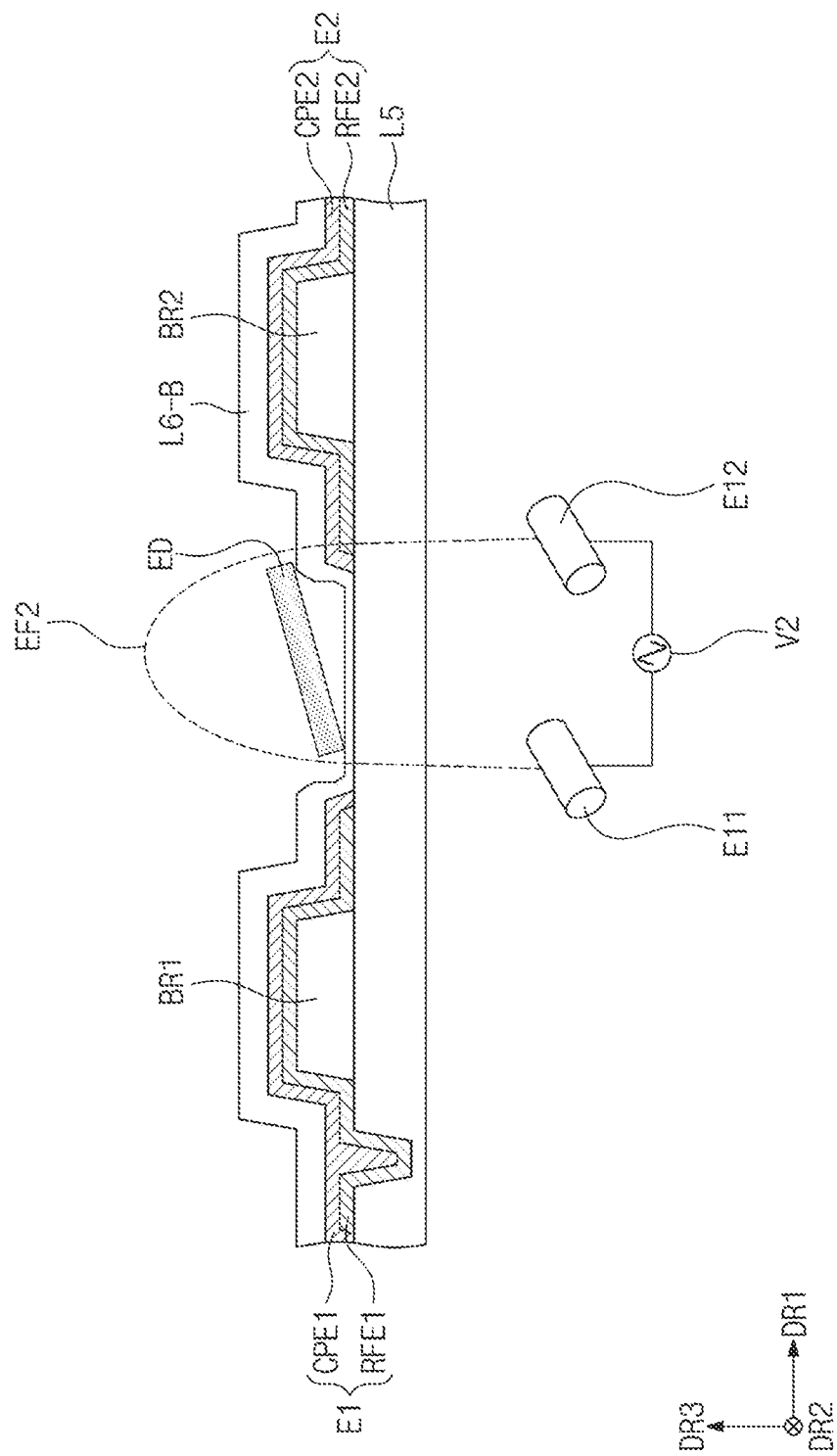

Referring to FIG. 7B, an electric field EF2 may be formed between a first external electrode E11 and a second external electrode E12 by applying a second voltage V2 to the first external electrode E11 and the second external electrode E12. Although a shape of each of the first external electrode E11 and the second external electrode E12 and a shape of the electric field EF2 between the first external electrode E11 and the second external electrode E12 are provided for convenience of description, shapes and sizes of each thereof may be variously changed.

In this embodiment, the first external electrode E11 is spaced a predetermined distance from the second external electrode E12 in the first direction DR1. Each of the first external electrode E11 and the second external electrode E12 is spaced a predetermined distance from the fifth insulation layer L5 in a direction opposite to the third direction DR3. A spaced distance between the first external electrode E11 and the second external electrode E12 and a spaced distance from the fifth insulation layer L5 in the direction opposite to the third direction DR3 may be determined in consideration of a direction and an intensity of the electric field EF2 that is appropriate for aligning the light emitting element ED. For example, the first external electrode E11 and the second external electrode E12 may be disposed on a bottom surface of an insulation surface. The insulation surface may represent, e.g., a bottom surface of the fifth insulation layer L5.

In this embodiment, the second voltage V2 may be an alternating current voltage of about ±40V and about 100 kHz. As a high voltage is applied to the first external electrode E11 and the second external electrode E12, the alignment degree of the light emitting element ED may improve.

Figure 7C:
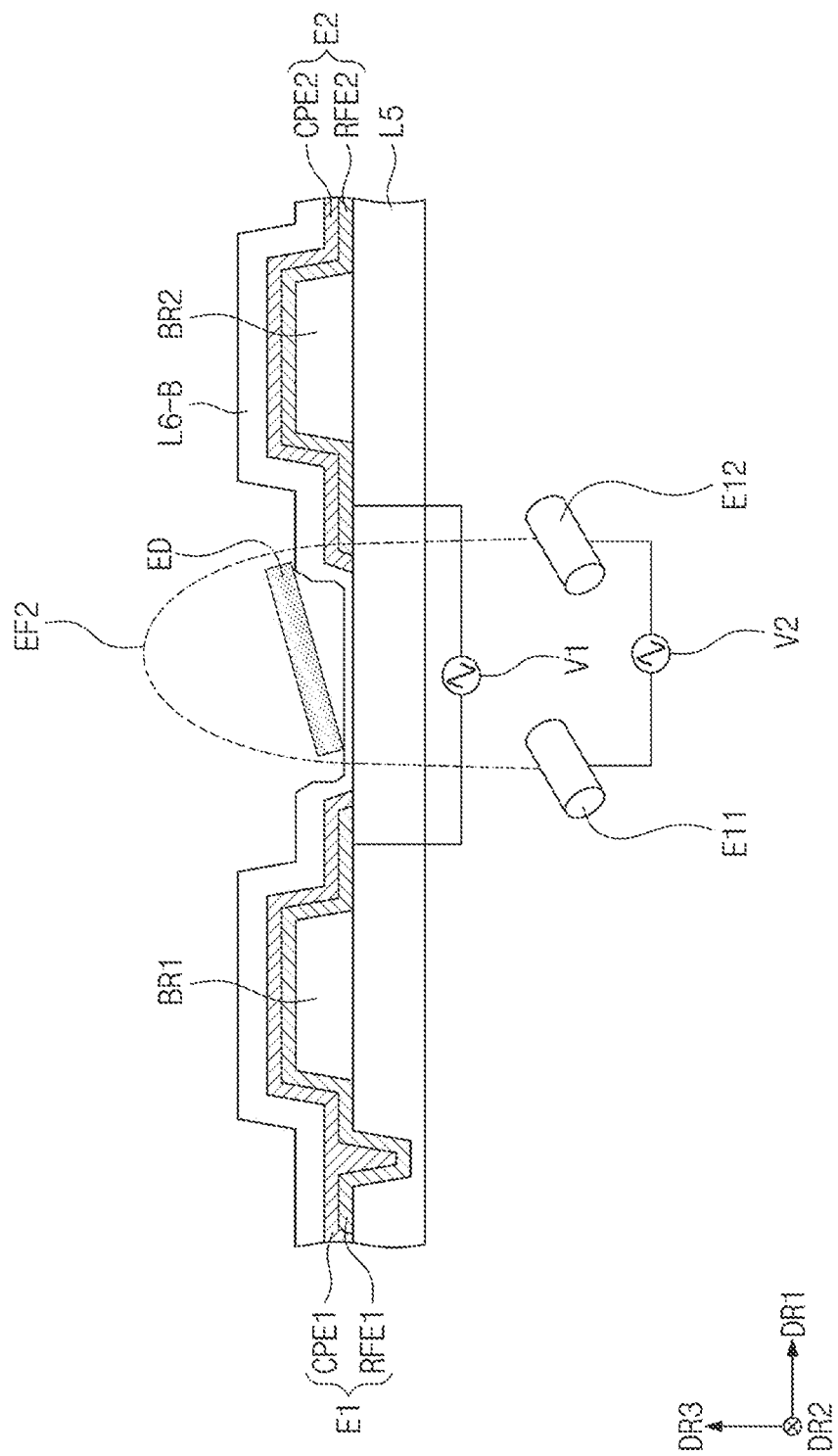

Referring to FIG. 7C, while the first voltage V1 is applied to the first electrode E1 and the second electrode E2, the second voltage V2 may be simultaneously applied to the first external electrode E11 and the second external electrode E12. In this embodiment, the first voltage V1 may be an alternating current voltage of about ±20V and about 100 kHz, and the second voltage V2 may be an alternating current voltage of about ±20V and about 100 kHz Also, in another embodiment, the light emitting element ED may be primarily aligned by applying the first voltage V1 to the first electrode E1 and the second electrode E2, and secondarily aligned by applying the second voltage V2 to the first external electrode E11 and the second external electrode E12.

Figure 7D:
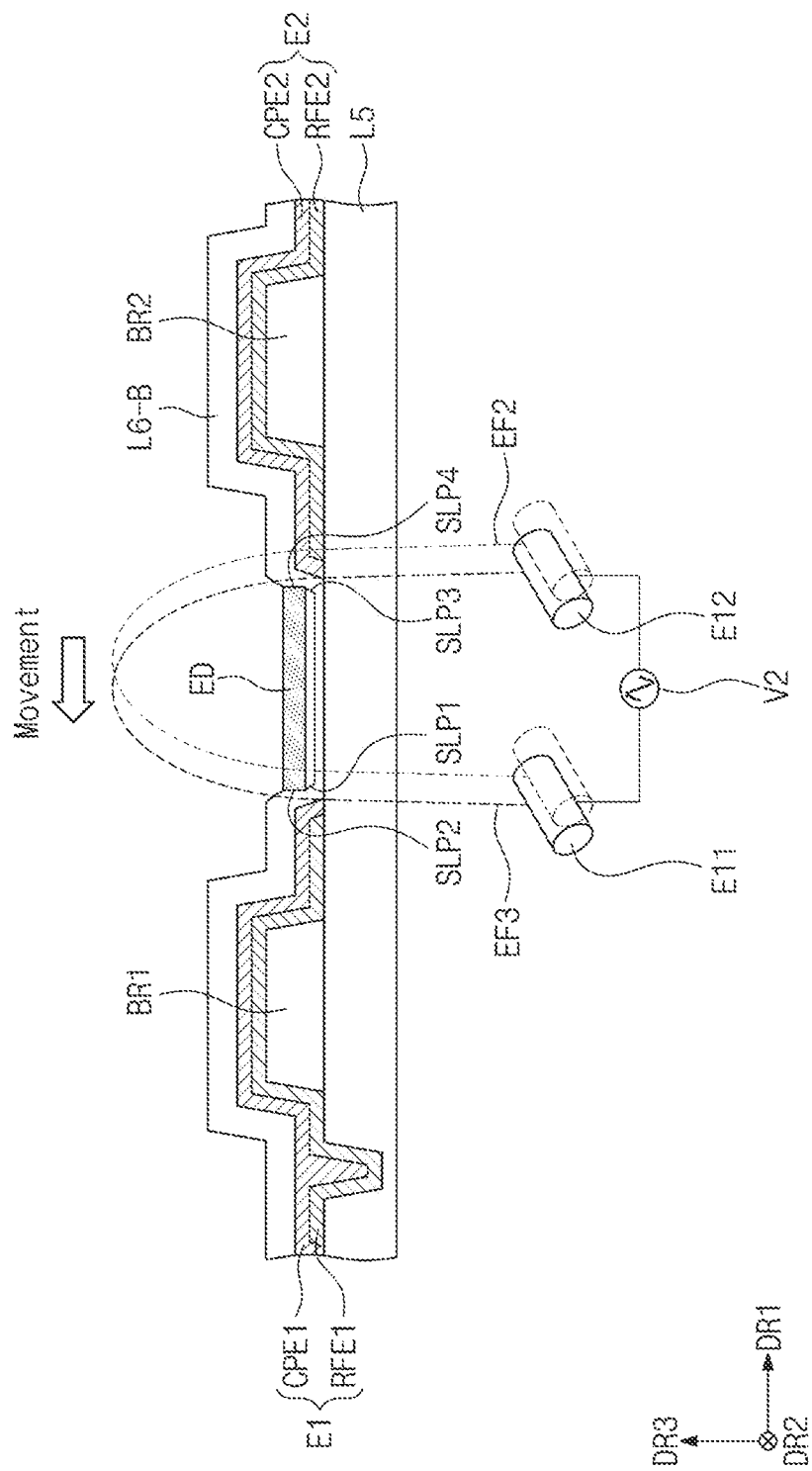

Referring to FIG. 7D, a position of each of the first external electrode E11 and the second external electrode E12 may move. For example, when the light emitting element ED is disposed biased to the second electrode E2, a position of each of the first external electrode E11 and the second external electrode E12 moves from around the second electrode E2 to around the first electrode E1, i.e., a direction opposite to the first direction DR1. While the position of each of the first external electrode E11 and the second external electrode E12 moves, supply of the second voltage V2 is maintained. Accordingly, as the electric field formed by the first external electrode E11 and the second external electrode E12 moves from the electric field EF2 to an electric field EF3, the light emitting element ED may move along a movement direction of the electric field. Accordingly, the alignment degree of the light emitting element ED may improve. Also, the light emitting element ED may further be conveniently located between the first electrode E1 and the second electrode E2 by the first to fourth inclined portion SP1 to SP4 of the sixth insulation layer L6-B. Accordingly, the alignment degree of the light emitting element ED may further improve.

Also, in another embodiment, the light emitting element ED may be primarily aligned by applying the first voltage V1 to the first electrode E1 and the second electrode E2, secondarily aligned by applying the second voltage V2 to the first external electrode E11 and the second external electrode E12, and thirdly aligned by moving the second external electrode E12 in a predetermined direction and then applying the second voltage V2 to the first external electrode E11 and the second external electrode E12. However, the inventive concept is not limited to the above-described first to third alignment order. For example, the alignment order may be variously changed, and the first to third alignment may be repeated several times. For example, the light emitting element ED may be primarily aligned by applying the second voltage V2 to the first external electrode E11 and the second external electrode E12, and then secondarily aligned by applying the first voltage V1 to the first electrode E1 and the second electrode E2.

Figure 8:
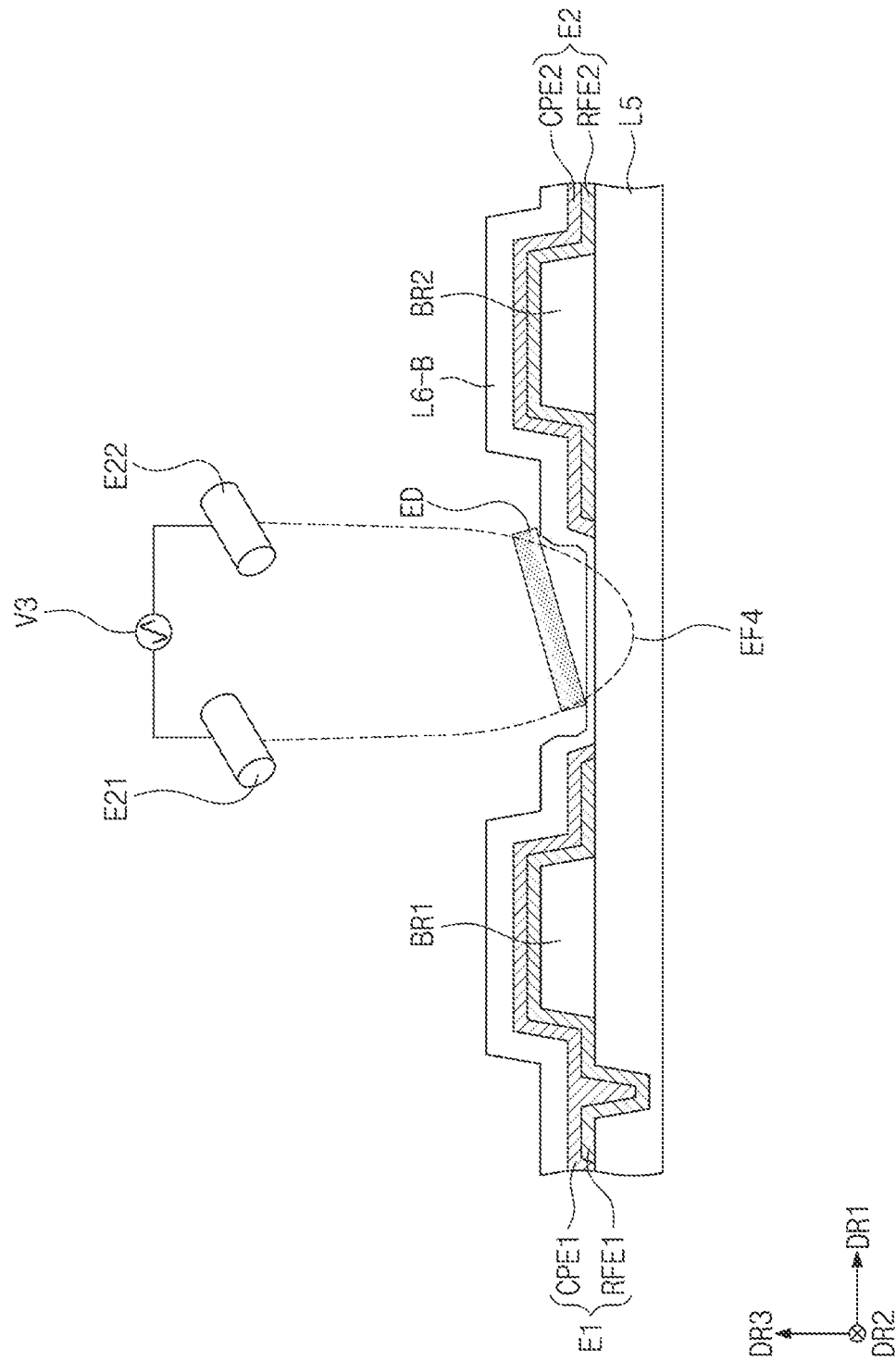
FIG. 8 is a view for explaining a method of aligning the light emitting element.

FIG. 8 is a view for explaining a method of aligning the light emitting element.

Referring to FIG. 8, an electric field EF4 may be formed between a first external electrode E21 and a second external electrode E22 by applying a third voltage V3 to the first external electrode E21 and the second external electrode E22. In this embodiment, the first external electrode E21 is spaced a predetermined distance from the second external electrode E22 in the first direction DR1. Each of the first external electrode E21 and the second external electrode E22 is spaced a predetermined distance in the third direction DR3 from the fifth insulation layer L5. A spaced distance between the first external electrode E21 and the second external electrode E22 and a spaced distance from the fifth insulation layer L5 in the third direction DR3 may be determined in consideration of a direction and an intensity of the electric field EF4 that is appropriate for aligning the light emitting element ED. For example, the first external electrode E21 and the second external electrode E22 may be disposed on an insulation surface. The insulation surface may represent, e.g., a bottom surface of the fifth insulation layer L5.

In this embodiment, the third voltage V3 may be an alternating current voltage of about ±40V and about 100 kHz. As a high voltage is applied to the first external electrode E21 and the second external electrode E22, the alignment degree of the light emitting element ED may improve.

Although not shown in the drawings, similar to the alignment method in FIG. 7C, while the first voltage V1 is applied to the first electrode E1 and the second electrode E2, the third voltage V2 may be simultaneously applied to the first external electrode E21 and the second external electrode E22. In this embodiment, the first voltage V1 may be an alternating current voltage of about ±20V and about 100 kHz, and the third voltage V3 may be an alternating current voltage of about ±20V and about 100 kHz FIG. 9 is a view for explaining a method of aligning the light emitting element.

Figure 9:
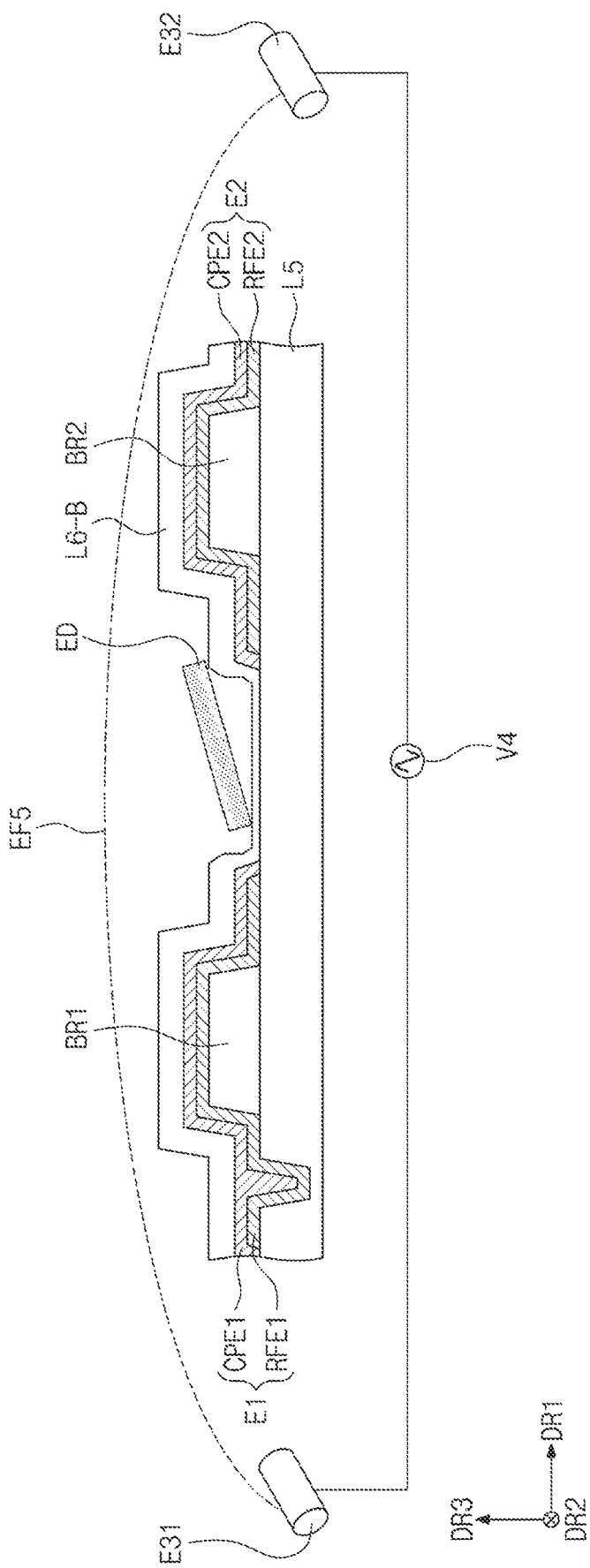
FIG. 9 is a view for explaining a method of aligning the light emitting element.

Referring to FIG. 9, an electric field EF5 may be formed between a first external electrode E31 and a second external electrode E32 by applying a fourth voltage V4 to the first external electrode E31 and the second external electrode E32. In this embodiment, the first external electrode E31 is spaced a predetermined distance from the first electrode E1 in a direction opposite to the first direction, and the second external electrode E32 is spaced a predetermined distance from the second electrode E2 in the first direction DR1. In an embodiment, the first external electrode E31 and the second external electrode E32 may be disposed at left and right sides of the display panel 110 in FIG. 1, respectively.

In this embodiment, the fourth voltage V4 may be an alternating current voltage of about ±40V and about 100 kHz. As a high voltage is applied to the first external electrode E31 and the second external electrode E32, the alignment degree of the light emitting element ED may improve. Also, the first external electrode E31 and the second external electrode E32 may move in the first, second, and third directions DR1, DR2, and DR3 so that the light emitting element ED is aligned between the first electrode E1 and the second electrode E2.

Although not shown in the drawings, similar to the alignment method in FIG. 7C, while the first voltage V1 is applied to the first electrode E1 and the second electrode E2, the fourth voltage V4 may be simultaneously applied to the first external electrode E31 and the second external electrode E32. In this embodiment, the first voltage V1 may be an alternating current voltage of about ±20V and about 100 kHz, and the fourth voltage V4 may be an alternating current voltage of about ±40V and about 100 kHz FIG. 10 is a perspective view illustrating a portion of the display device in FIG. 6I.

Figure 10:
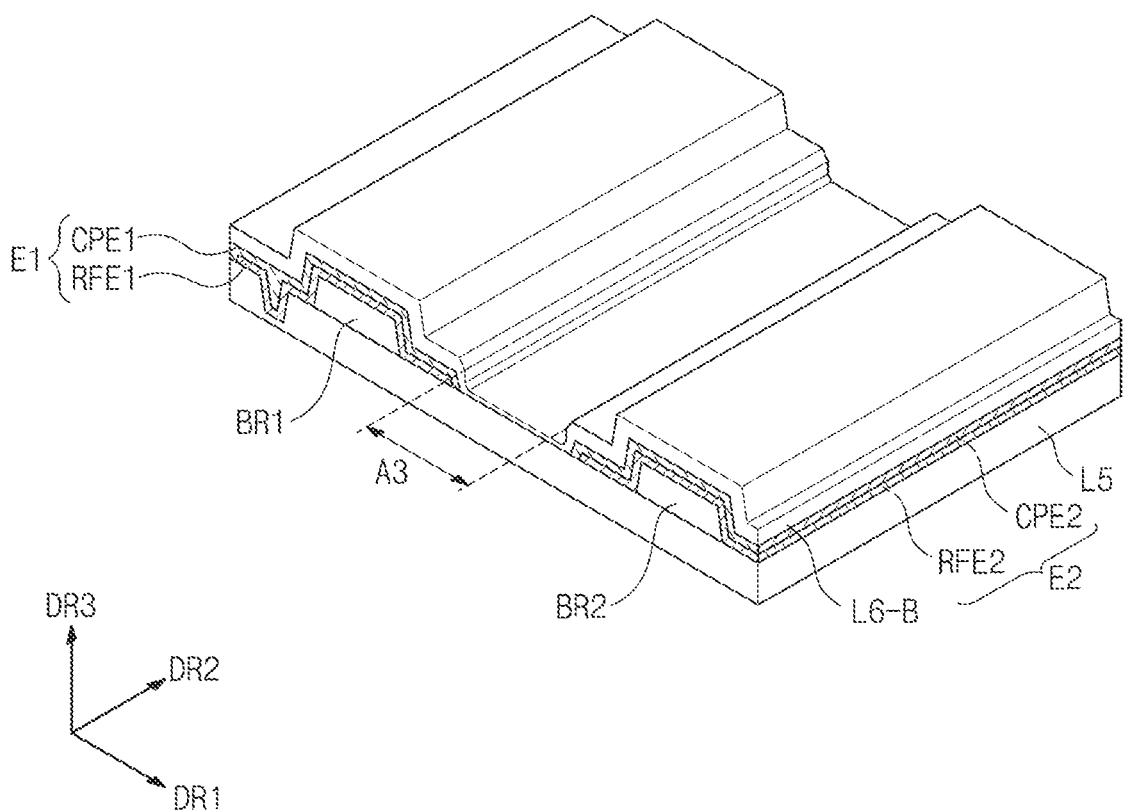
FIG. 10 is a perspective view illustrating a portion of a display device in FIG. 6I.

Although only the fifth insulation layer L5, the second electrode E2, and the sixth insulation layer L6-B are illustrated in FIG. 10, the switching transistor TR1, the driving transistor TR2, and the capacitor C1 may be further disposed below the fifth insulation layer L5.

Referring to FIG. 10, the stopper area A3 may be disposed between the first electrode E1 and the second electrode E2. The stopper area A3 extends in the second direction DR2. As illustrated in FIG. 3A, at least one light emitting element ED may be disposed on the stopper area A3.

According to an embodiment of the inventive concept, since the stopper area A3 is provided between the first electrode E1 and the second electrode E2, the light emitting element ED may be accommodated in the stopper area A3. Accordingly, the light emitting element ED may further be easily aligned.

Figure 11:
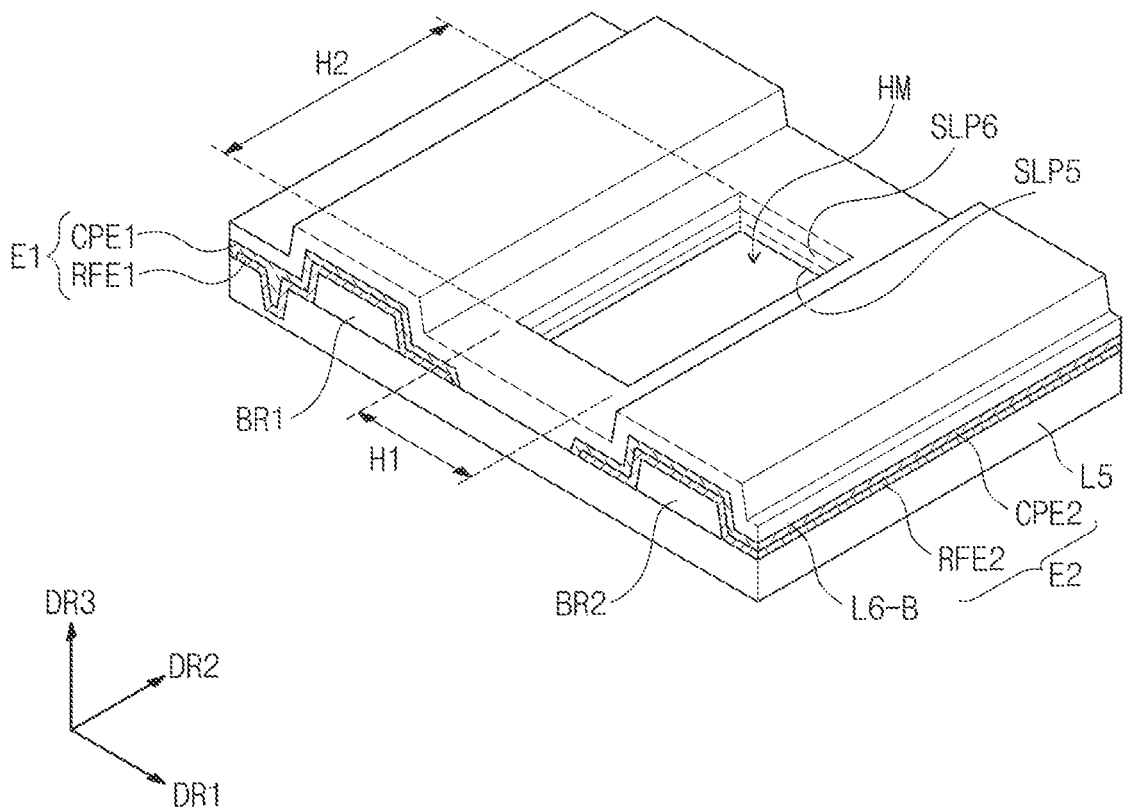
FIG. 11 is a perspective view illustrating a portion of the display device in FIG. 6I.

FIG. 11 is a perspective view illustrating a portion of the display device in FIG. 6I.

Although only the fifth insulation layer L5, the second electrode E2, and the sixth insulation layer L6-B are illustrated in FIG. 11, the switching transistor TR1, the driving transistor TR2, and the capacitor C1 may also be disposed below the fifth insulation layer L5.

Referring to FIG. 11, a stopper groove HM may be defined in the sixth insulation layer L6-B. The stopper groove HM may have a rectangular shape having a first length H1 in the first direction DR1 and a second length H2 in the second direction DR2. The first length of the stopper groove HM may be equal to a width of the stopper area A3 in FIG. 6I. At least one light emitting element ED may be disposed in the stopper groove HM.

Since the stopper groove HM includes inclined surfaces SLP5 and SLP6 in the second direction DR2 as well as those in the first direction DR1, the light emitting element ED may be easily accommodated in the stopper area A3. Accordingly, the light emitting element ED may further be easily aligned.

Figure 12A:
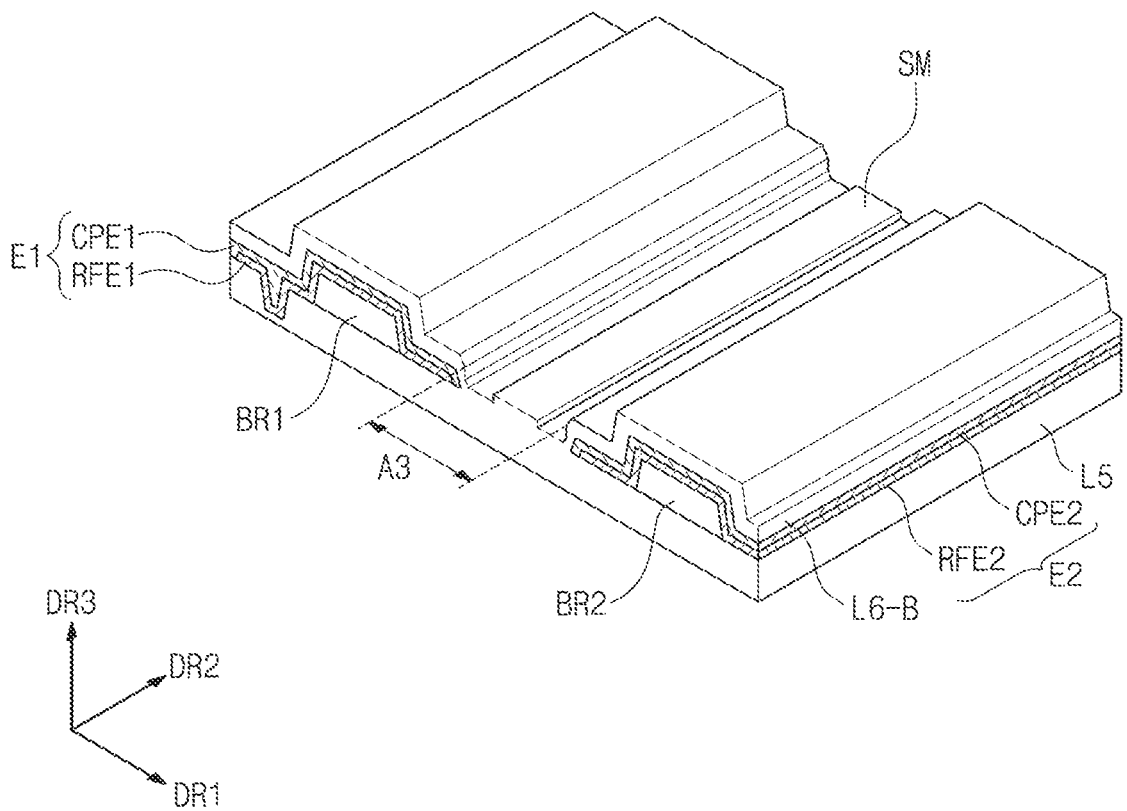
FIG. 12A is a perspective view illustrating a portion of a display device.

FIG. 12A is a perspective view illustrating a portion of the display device.

Referring to FIG. 12A, the stopper area A3 may be disposed between the first electrode E1 and the second electrode E2. The stopper area A3 extends in the second direction DR2. A support part SM, which is formed of the sixth insulation layer L6-B, may be disposed on a central portion of the stopper area A3.

The support part SM may be formed of the sixth insulation layer L6-B, which is not removed by a photoresist pattern (not shown) formed in the same layer as the third photoresist pattern OLP3 on the sixth insulation layer L6-B.

Figure 12B:
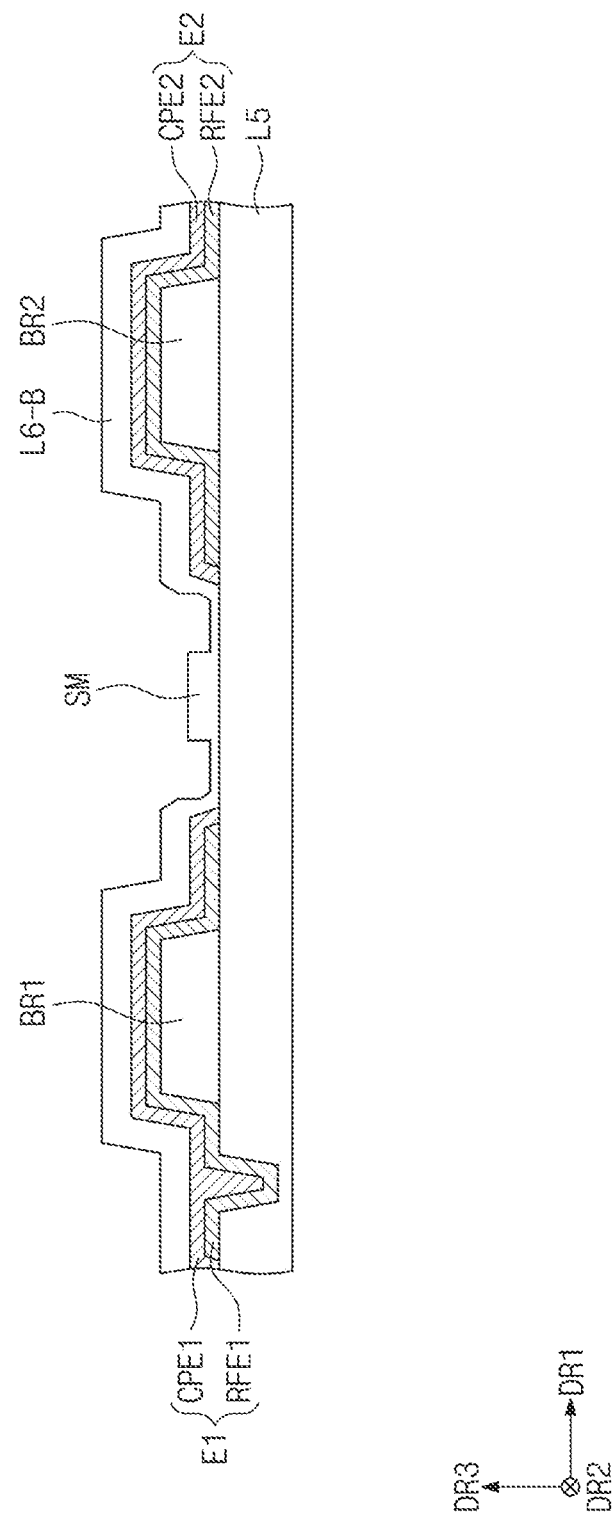
FIG. 12B is a cross-sectional view illustrating the display device in FIG. 12A.

FIG. 12B is a cross-sectional view illustrating the display device in FIG. 12A.

Referring to FIG. 12B, the support part SM may be disposed on the stopper area A3 between the first electrode E1 and the second electrode E2. The support part SM may be spaced a predetermined distance from each of the first electrode E1 and the second electrode E2 in the first direction DR1. The support part SM may support the light emitting element ED that is arranged in a following process.

Figure 13:
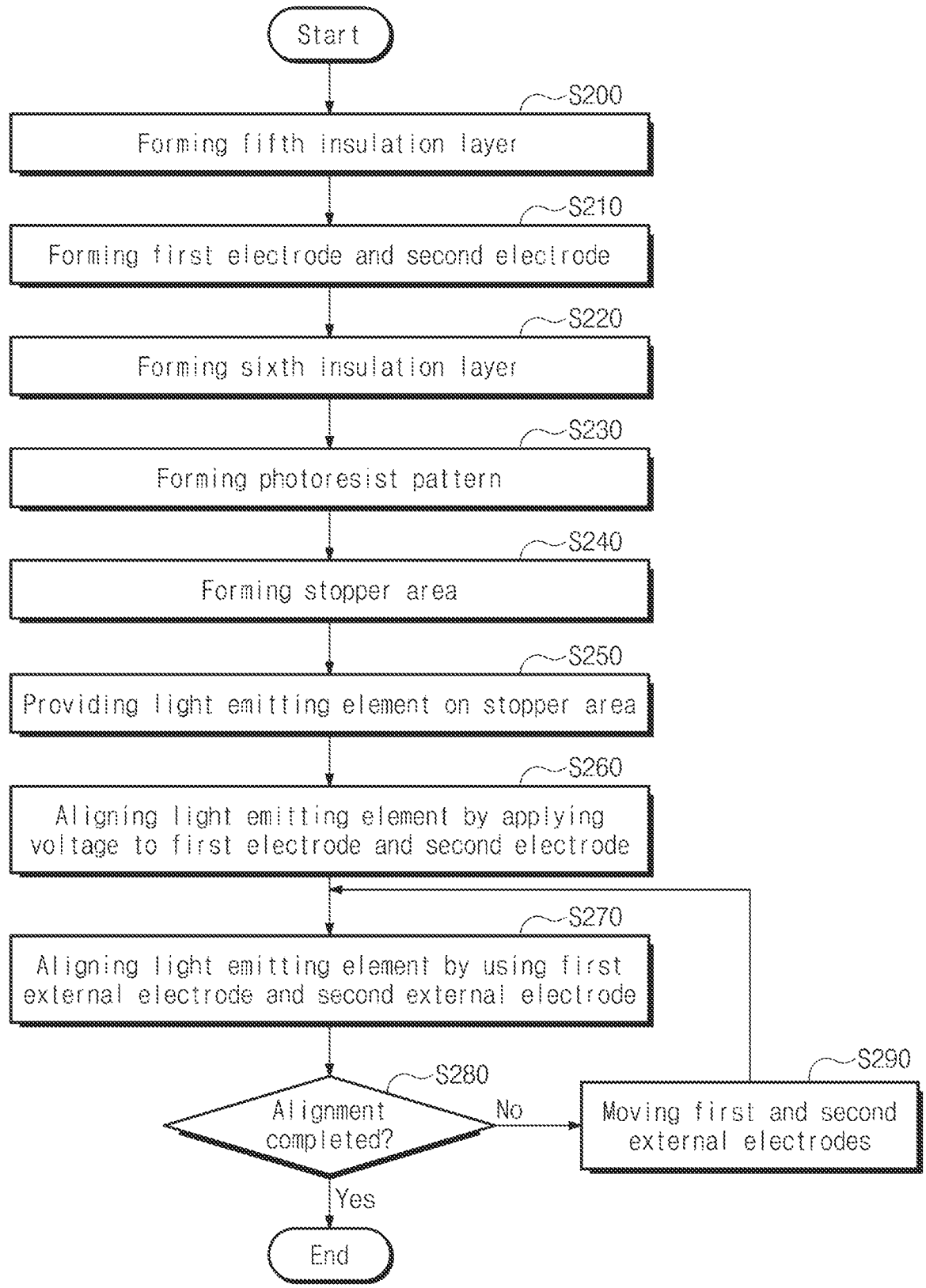
FIG. 13 is a flowchart for explaining a method of manufacturing the display device according to an embodiment of the inventive concept.

FIG. 13 is a flowchart for explaining a method of manufacturing the display device according to an embodiment of the inventive concept.

Although a method of manufacturing the display device in FIG. 13 is described with reference to FIGS. 6A, 6L, 7A, and 7B for convenience of description, the inventive concept is not limited thereto.

First, referring to FIGS. 6A and 13, the switching transistor TR1 and the driving transistor TR2 are formed on the first base layer BL1. The fifth insulation layer L5 is formed on the switching transistor TR1 and the driving transistor TR2 in operation S200.

Referring to FIGS. 6G and 13, the first electrode E1 and the second electrode E2 are formed on the fifth insulation layer L5 in operation S210.

Referring to FIGS. 6H and 13, the sixth insulation layer L6-B covering the first electrode E1 and the second electrode E2 is formed in operation S220. The sixth insulation layer L6-B may have a thickness of about 5000 Å.

The third photoresist pattern OLP3 is formed on the sixth insulation layer L6-B in operation S230. The portion of the sixth insulation layer L6-B, which is exposed from the third photoresist pattern OLP3, may be removed in operation S240.

Referring to FIGS. 6I and 13, the solution 30 containing the light emitting element ED may be applied on the stopper area A3 between the first electrode E1 and the second electrode E2 in operation S250.

Referring to FIGS. 6K, 7A, and 13, the electric field EF1 is formed between the first electrode E1 and the second electrode E2 by applying the first voltage V1 therebetween. Dipolarity may be induced to the light emitting element ED by the electric field, and the light emitting element ED may be aligned between the first electrode E1 and the second electrode E2 by an electrophoresis force in operation S260.

Referring to FIGS. 7B and 13, the electric field EF2 may be formed between the first external electrode E11 and the second external electrode E12 by applying the second voltage V2 to the first external electrode E11 and the second external electrode E12. The light emitting element ED may be aligned between the first electrode E1 and the second electrode E2 by the electric field in operation S270.

Whether alignment of the light emitting element ED at a desired position between the first electrode E1 and the second electrode E2 is completed is determined in operation S280.

When the alignment of the light emitting element ED between the first electrode E1 and the second electrode E2 is not completed as illustrated in FIG. 7C, a position of each of the first external electrode E11 and the second external electrode E12 moves as illustrated in FIG. 7D in operation S290.

Alignment operations of the operation S270 to the operation S290 may be repeatedly performed until the alignment of the light emitting element ED is completed.

The display device having the above-described configuration forms the insulation layer disposed on the first electrode and the second electrode to have the stopper shape so that the micro light emitting element is easily aligned. The display device may have improved reliability through the improvement of the alignment degree of the micro light emitting element. Also, as the micro light emitting element is aligned by using the electric field formed by the external electrode, the light emitting element may further be easily aligned. Thus, the reliability of the display device may improve.

Although the exemplary embodiments of the present inventive concept have been described, it is understood that the present inventive concept should not be limited to these exemplary embodiments but various changes and modifications can be made by one ordinary skilled in the art within the spirit and scope of the present inventive concept as hereinafter claimed. Hence, the real protective scope of the inventive concept shall be determined by the technical scope of the accompanying claims.

What is claimed is:

1. A method of manufacturing a display device, the method comprising:
forming a first insulation layer on an insulation surface;
forming a conductive layer on the first insulation layer;
forming a first electrode and a second electrode by patterning the conductive layer;
forming a second insulation layer covering the first electrode, the second electrode, and the first insulation layer disposed between the first electrode and the second electrode;
forming a photoresist pattern on the second insulation layer;
forming a stopper area by removing a portion of the second insulation layer, which is exposed from the photoresist pattern;
providing a light emitting element on the stopper area; and
aligning the light emitting element, wherein the stopper area is disposed between the first electrode and the second electrode.

2. The method of claim 1, wherein the forming of the stopper area comprises dry-etching a portion in a thickness direction of the stopper area of the second insulation layer.

3. The method of claim 1, wherein the second insulation layer comprises a first area overlapping the first electrode, a second area overlapping the second electrode, and the stopper area,
wherein and the stopper area has a thickness different from that of each of the first area and the second area.

4. The method of claim 3, wherein the stopper area comprises a first side portion and a second side portion,
wherein the first side portion has a first inclined surface and a second inclined surface, which have inclinations that are different from each other, and
wherein the second side portion has a third inclined surface and a fourth inclined surface, which have inclinations that are different from each other.

5. The method of claim 4, wherein the aligning of the light emitting element comprises:
supplying a voltage to the first electrode and the second electrode; and
supplying a voltage to a first external electrode and a second external electrode.

6. The method of claim 5, wherein the supplying of the voltage to the first external electrode and the second external electrode comprises:
supplying the voltage to the first external electrode and the second external electrode, which are disposed below the insulation surface; and
moving the first external electrode and the second external electrode.

7. The method of claim 6, wherein the moving of the first external electrode and the second external electrode comprises
moving the first external electrode and the second external electrode in a repeated manner until a first end of the light emitting element is disposed on a boundary at which the first inclined surface meets the second inclined surface and until a second end of the light emitting element is disposed on a boundary at which the third inclined surface meets the fourth inclined surface.

8. The method of claim 5, wherein the supplying of the voltage to the first external electrode and the second external electrode comprises:
arranging the first external electrode and the second external electrode at respective positions spaced from the light emitting element on the insulation surface; and
supplying an alternating current voltage to the to the first external electrode and the second external electrode.

9. The method of claim 5, wherein the supplying of the voltage to the first external electrode and the second external electrode comprises:
arranging the first external electrode at a position spaced from the first electrode in a first direction;
arranging the second external electrode at a position spaced from the second electrode in a second direction that is opposite to the first direction; and
supplying an alternating current voltage to the first external electrode and the second external electrode.

* * * * *

UNITED STATES PATENT AND TRADEMARK OFFICE
CERTIFICATE OF CORRECTION

PATENT NO. : 11,637,222 B2  
APPLICATION NO. : 17/334486  
DATED : April 25, 2023  
INVENTOR(S) : Seungcheol Ko et al.

It is certified that error appears in the above-identified patent and that said Letters Patent is hereby corrected as shown below:

In the Claims

Column 22, Line 19 (Approx.), Claim 8     Delete "to the to the" and  
Insert -- to the --

Signed and Sealed this  
First Day of August, 2023

Katherine Kelly Vidal  
*Director of the United States Patent and Trademark Office*